United States Patent [19]

Clanton, III et al.

[11] Patent Number: 5,524,195
[45] Date of Patent: Jun. 4, 1996

[54] GRAPHICAL USER INTERFACE FOR INTERACTIVE TELEVISION WITH AN ANIMATED AGENT

[75] Inventors: Charles H. Clanton, III, San Francisco, Calif.; Emilie Young, Boulder, Colo.; Joseph M. Palrang; Marcel D. Janssens, both of Sunnyvale, Calif.

[73] Assignee: Sun Microsystems, Inc., Mountain View, Calif.

[21] Appl. No.: 206,749

[22] Filed: Mar. 4, 1994

Related U.S. Application Data

[63] Continuation-in-part of Ser. No. 67,574, May 24, 1993.
[51] Int. Cl.⁶ .................................................. G06F 15/00
[52] U.S. Cl. .......................... 395/155; 395/161; 395/159; 395/153; 395/154; 395/156; 395/152; 345/173; 348/13; 348/7; 348/12
[58] Field of Search ...................................... 395/152–153, 395/161, 149; 345/117–120, 146, 902, 173–178, 122; 348/6–7, 12–13; 434/110

[56] References Cited

U.S. PATENT DOCUMENTS

| | | | |
|---|---|---|---|
| 4,706,121 | 10/1987 | Young | 348/6 |
| 4,712,191 | 12/1987 | Penna | 395/156 |
| 4,788,538 | 11/1988 | Klein et al. | 395/149 X |
| 4,995,078 | 2/1991 | Monslow et al. | 348/6 |
| 5,021,976 | 6/1991 | Wexelblat et al. | 395/159 |
| 5,093,718 | 3/1992 | Hoarty et al. | 348/7 |
| 5,204,947 | 4/1993 | Bernstein et al. | 395/154 X |
| 5,206,722 | 4/1993 | Kwan | 348/7 |
| 5,233,687 | 8/1993 | Henderson, Jr. et al. | 395/157 |
| 5,247,347 | 9/1993 | Litteral et al. | 348/7 |
| 5,357,276 | 10/1994 | Banker et al. | 348/7 |
| 5,361,091 | 11/1994 | Hoarty et al. | 348/7 |
| 5,388,993 | 2/1995 | McKiel et al. | 395/155 X |
| 5,396,546 | 3/1995 | Remillard | 348/7 |

FOREIGN PATENT DOCUMENTS 9311639  11/1992  WIPO .............................. H04N 7/16

OTHER PUBLICATIONS

Jeffrey J. Blatt, "A Primer on User Interface Software Patents", (The Computer Lawyer, vol. 9, No. 4, Apr. 1992).
Hoarty, Multimedia on Cable Television Systems, Oct. 5, 1993, pp. 555–567. (IBM), Conferencing Metaphor, Feb. 2, 1993, pp. 63–66.
Tanigawa, Personal Multimedia–Multipoint Teleconference System, Apr. 7, 1991, pp. 1127–1144.

Primary Examiner—Raymond J. Bayerl
Assistant Examiner—John E. Breene
Attorney, Agent, or Firm—Irell & Manella

[57] ABSTRACT

A graphical user interface for displaying and selecting video programs, such as video on demand, includes a video on demand server coupled to a communication medium. A plurality of settop box receivers are coupled to the communication medium for receiving digitized programming in the form of movies and the like from the video on demand server. The settop box includes a central processing unit (CPU) coupled to a memory and other electronic modules. The CPU generates and displays the graphical user interface on the subscriber's television. The graphical user interface is based upon a metaphor in which a world of spaces are organized as part of a studio back lot through which a user may navigate. The back lot includes a Poster wall which presents to the user a series of movie posters representing available selections. When a user touches a Poster on a touch sensitive screen of the television, the CPU generates an animation which displays the Poster coming off of the wall and appearing in the foreground of the screen. If a subscriber selects the Poster to view a feature presentation, the video on demand server downloads the selected video which is displayed on the television. The interface of the present invention further includes Extras which appear in animated form on the interface and move freely between spaces within the studio back lot metaphor. If a user selects an Extra, the Extra is transformed into a movie poster or advertisement. The user may then select the Poster and view the feature presentation.

64 Claims, 22 Drawing Sheets

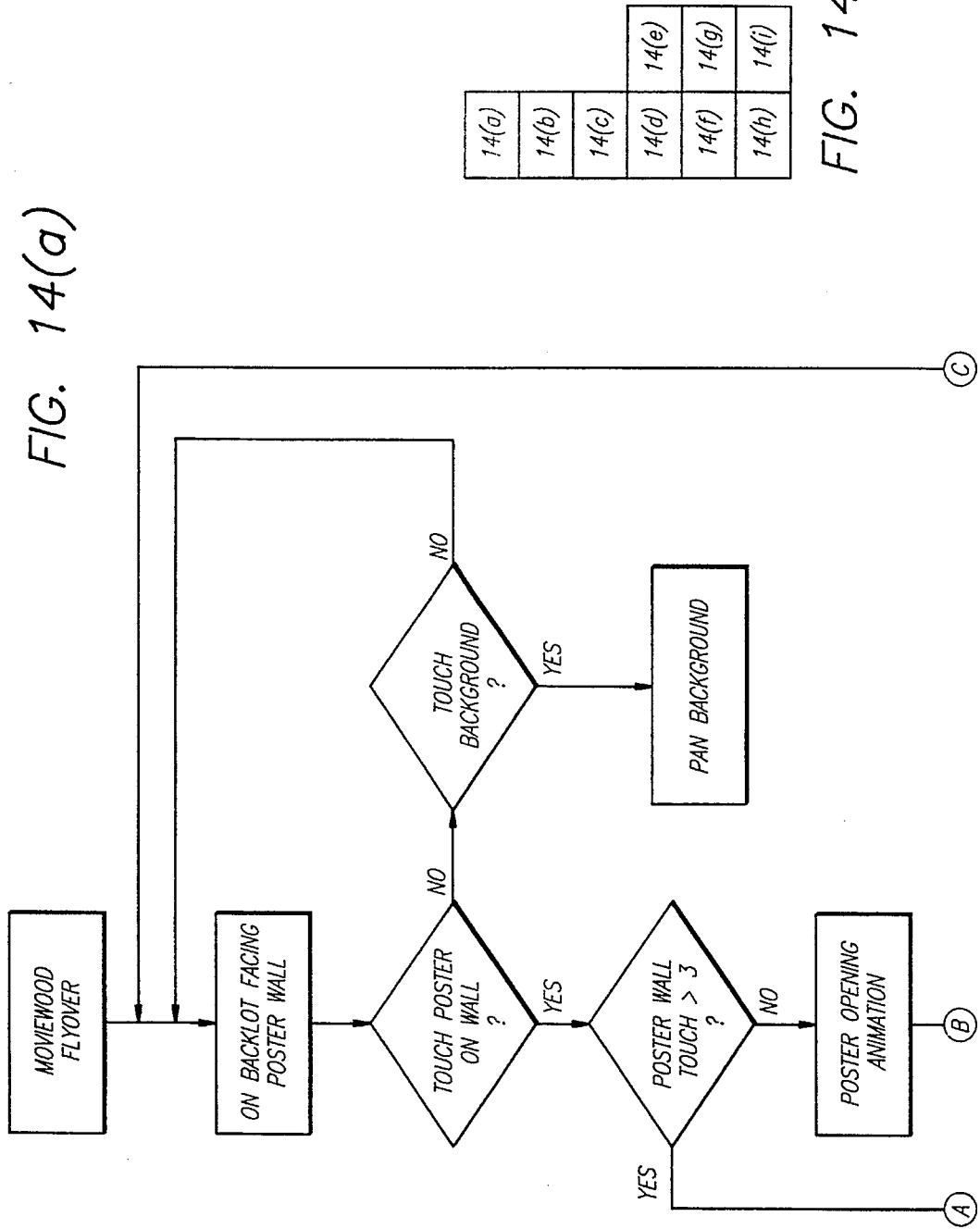

GRAPHICAL USER INTERFACE FOR INTERACTIVE TELEVISION WITH AN ANIMATED AGENT

RELATED APPLICATIONS

The present application is a continuation in part of application Ser. No. 08/067,574, filed May 24, 1993, entitled "Improved Graphical User Interface With Method And Apparatus For Interfacing To Remote Devices" (hereinafter referred to as the "Parent"), assigned to the Assignee of the present invention, First Person, Inc., and is hereby incorporated fully herein by reference.

BACKGROUND OF THE INVENTION

1. Field of the Invention

The present invention relates to the field of graphical user interfaces and multi-media display systems. More particularly, the present invention relates to a method and apparatus for selecting, viewing, and interacting with, programs and services from a source provider, such as for example, a video on demand server and/or an interactive multi-media system.

2. Art Background

The combination of computer technology with television (TV) and audiovisual (A/V) systems has fostered the development of multimedia interactive entertainment systems. It is known that users desire interactive television and multi-media applications for home use. In particular, users desire to have maximum system flexibility, which permits the user to view any one of a selected number of movies or other audiovisual programs on demand from their home audiovisual television system. Advances in the digitalization and digital compression of data, in conjunction with improved communication transmission media, such as fiber optics, permit high-speed downloading of digitized data from a head end source provider to a plurality of users. The broad bandwidth of fiber optic cables permits interactivity between the user (herein referred to at times as a "subscriber"), and a source provider.

A variety of video on demand (VOD) systems have been proposed to permit a subscriber to select and view a video program at his convenience. The subscriber communicates to a source provider at a head-end, a request for a specified video program, such as a movie, at a specified time. The source provider then transmits the program to the subscriber in a manner such that it may be received during the specified time only, and by the single subscriber requesting and paying for it, without reception by other subscribers. (See for example, U.S. Pat. Nos. 5,206,722; 4,995,078; and 5,247,347).

One of the most significant challenges in providing interactive television service and video on demand (VOD) capability, is the design of an interface which is easy and fun to use by average consumers. Historically, interactive television and pay-per-view ("PPV") systems which have been proposed provide a downloaded television listing of programs, video on demand movies, and other options for the user to choose from and execute. The subscriber, utilizing a remote control device in conjunction with a settop box coupled to a cable television, satellite direct broadcast or other communication system, selects a desired movie or program to be viewed. One such system is that disclosed by U.S. Pat. No. 4,706,121 (hereinafter the '121 patent), issued Nov. 10, 1987 to Patrick Young. The system disclosed by the '121 patent provides that a downloaded television listing, including available movies for viewing, is displayed on a subscriber's television receiver. The downloaded television listing information may be viewed by title, category, date, as well as start time. Although the downloaded program information is displayed for user selection, the interface provided to the user is a simple listing of available source material for selection.

In the computer industry, a variety of graphic user interfaces have been developed to facilitate human interaction with computer systems. Many display systems utilize metaphors in the design of the interface as a way to maximize human familiarity, and convey information between the user and computer. It is well known that designing around a familiar metaphor helps reduce human learning time. Research in interface design using metaphors and man-machine interfaces, may be applied to multimedia systems, and in particular, to interactive television systems having video on demand capability. The marriage of video and television technology with computer interface technology provides users with maximum flexibility in storing, retrieving, and selecting television and other audiovisual programming.

As will be disclosed, the present invention's user interface provides a user friendly mechanism for subscribers to select and view audiovisual programming, such as movies and the like, using an intuitive user interface, which is fun and interesting to use. As will be described, the user interface of the present invention utilizes a metaphor in the form of a motion picture production studio back lot. Various spaces and objects exist in the metaphor, in both static and animated form, for identifying available programming and for providing a mechanism for the selection and viewing of a desired program by a subscriber.

SUMMARY OF THE INVENTION

The present invention provides apparatus and methods for presenting an improved graphical user interface for displaying and selecting video on demand programs, as well as other audiovisual programs and interactive services. In one embodiment, a video on demand (VOD) server is coupled to a communication medium which is in turn coupled to a plurality of subscribers. A settop box is coupled to the communication medium at each subscriber's location, for receiving digitized programming in the form of movies, television signals and other data from the video on demand server at the head end. The settop box is coupled to a television or audiovisual entertainment system. The settop box includes a central processing unit (CPU) coupled to a memory and other electronic modules such as decoders, decompressors and audiovisual generators. Computer programming and data files are stored within the memory and accessible by the CPU. The CPU generates and displays the present invention's graphical user interface on the subscriber's television, and controls any interactive communication between the user, the video on demand server, as well as any other head-end provider of audiovisual material.

The graphical interface of the present invention is based upon a metaphor in which a world of Spaces is organized as part of a movie studio back lot metaphor through which a user may navigate. The back lot metaphor includes a Poster wall which presents to the user a series of movie Posters representing available selections. The Poster wall may include video selections for movies and/or other programming arranged by category, viewer preference, "Top 10" listings for the week, or any combination thereof.

In the presently preferred embodiment, when a user selects a Poster using a touch sensitive input device, the CPU senses the user's selection and generates an animation which displays the Poster coming off the wall and appearing in the foreground of the television screen. Once the Poster has moved to the foreground, additional information about the movie or other service is provided to the user by reading the Poster itself. By again touching the touch sensitive input device to select the image of the Poster, the CPU generates an opening animation includes the presentation of a video preview. If not selected, the Poster prompts the user to further action by moving in an animated fashion.

The graphical user interface of the present invention includes a video viewing space where a preview of the movie is shown. The video viewing space includes a plurality of control button functions and displays controlling, for example, volume, mute, channel and current channel selection, intermission, intermission status, selection of the feature presentation, and exit. In the present embodiment, an animated cash register icon is displayed to permit a user to ascertain movie price, select, and thereby "purchase" the desired movie. Touching the input device, or otherwise activating the cash register function, results in a "ring-up" sale animation, and the termination of any currently displayed preview, along with the initiation of viewing of the feature presentation. Upon selection of the cash register icon, the video on demand server downloads the selected video to the settop box for display on the user's television.

The interface of the present invention further includes Agents referred to as "Extras" which are manifestations of the Agent described in the Parent of this application, and are metaphors for category or advertisements for specific movies. Extras appear in an animated form on the user interface and move freely between Spaces within the studio back lot metaphor. If the user takes no action towards an Extra, the Extra simply moves out of the field of view of the user on the interface. However, if a user selects an Extra, the CPU senses the selection of the Extra and initiates an animated sequence in which the Extra introduces a Poster to the user. If a user is interested in viewing the Extra's advertised movie, the Poster introduced by the Extra behaves in the same manner as a Poster which has been selected from the Poster wall. In the event a user is not interested in viewing the video advertised by the Extra, the user may touch any area on the background of the interface and the Poster is dismissed in an animated fashion by the CPU.

BRIEF DESCRIPTION OF THE DRAWINGS

FIG. 14 is a map to assist the reader in understanding of the organization of the flowcharts of FIGS. 14(a) through 14(i).

FIGS. 14(a) and 14(b) illustrate flow charts of the operation of the present invention for the selection of a movie displayed on the present invention's Poster wall.

NOTATION AND NOMENCLATURE

Figure 1:
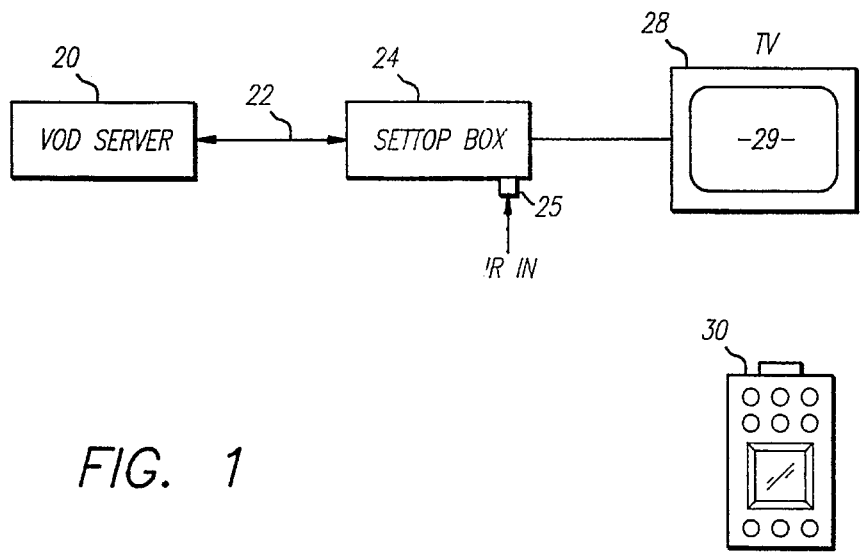
FIG. 1 is a functional block diagram of one possible interactive television/video on demand system utilizing the teachings of present invention.

The detailed descriptions which follow are presented largely in terms of interface display images, methods, algorithms and symbolic representations of operations of data bits within a computer memory. These algorithmic descriptions and representations are the means used by those skilled in the data processing arts to most effectively convey the substance of their work to others skilled in the art.

An algorithm is here, and generally, conceived to be a self consistent sequence of steps leading to a desired result. These steps are those requiring physical manipulations of physical quantities. Usually, though not necessarily, these quantities take the form of electrical or magnetic signals capable of being stored, transferred, combined, compared, displayed and otherwise manipulated. It proves convenient at times, principally for reasons of common usage, to refer to these signals as bits, values, Spaces, objects, elements, symbols, characters, Agents, images, terms, numbers or the like. It should be borne in mind, however, that all of these and similar terms are to be associated with the appropriate physical quantities, and are merely convenient labels applied to these quantities.

In the present case, the operations described herein are machine operations performed in conjunction with the human operator. Useful machines for performing the operations of the present invention include general purpose digital computers, digitally controlled displays, or other similar devices such as settop box control systems, video on demand servers and the like. In all cases, there should be borne in mind the distinction between the method operations of operating a computer, multi-media display, video on demand, or other similar system, and the method of computation itself. The present invention relates to apparatus and method steps for operating a computer and/or interactive multi-media display systems, and processing electrical or other physical signals to generate other desired physical signals.

The present invention also relates to apparatus for performing these operations. This apparatus may be specially constructed for the required purposes or it may comprise a general purpose computer selectively activated or reconfigured by a computer program stored in the computer. The method steps presented herein are not inherently related to any particular computer or other apparatus. In particular, various general purpose machines may be used with programs in accordance with the teachings herein, or it may prove more convenient to construct more specialized apparatus to perform the required steps.

Additionally, no particular programming language has been indicated for carrying out the various methods described herein. This is due in part to the fact that not all languages might be mentioned are universally available. Each designer of a particular computer, interactive multimedia system, or other display apparatus will be aware of a language which is most suitable for his immediate purposes. In practice, it has proven useful to substantially implement the present invention in a high level language which is then compiled into machine executable object code. Because the computers, servers, settop boxes and other devices which may be used in practicing the instant invention consist of many diverse elements, no detailed program listing has been provided. It is considered that the operations and other procedures described herein and illustrated in the accompanying drawings are sufficiently disclosed to enable one of ordinary skill to practice the instant invention.

DETAILED DESCRIPTION OF THE INVENTION

The following detailed description will be divided into several sections. The first of these will describe a general system arrangement for generating and displaying the user interface of the present invention. The general system description will describe one possible video on demand system incorporating the teachings of the present invention. Subsequent sections will describe various functional aspects of the present invention, such as the present invention's studio back lot metaphor, Poster wall and Poster Agents, "Extras" and other interactive features, as well as the overall structure and operation of the present invention's interface.

In the following description, numerous specific details are set forth to provide a thorough understanding of the present invention. These details include functional blocks representing data processing devices, state diagrams, screen, menu and other configurations to assist the user in navigating through the interface, and to provide a thorough understanding of the present invention. It will be apparent to one skilled in the art that the present invention may be practiced without these specific details. Additionally, although the user interface of the present invention is described with reference to a video on demand system, many of the features and other aspects of the present invention have application to a variety of other graphic user interface systems and environments. In other instances, well known circuits and structures are not described in detail so as not to obscure the present invention unnecessarily.

Moreover, many of the functions and features of the present invention, such as various objects displayed in the studio back lot metaphor, Poster Agents, "Extras", icons, and selection methods, are not static events and are perceived by the user as having motion, color, sound and/or animation. The present invention also includes audio features utilizing sounds, which compliment the visual interface and are played in some instances simultaneously with other functions of the present invention, and which cannot be illustrated graphically herein, but are, nevertheless, part of the present invention. Due to the limitations of a written specification, the reader is referred to a video tape entitled "Video on Demand User Interface" submitted by the applicants concurrent with the filing of the application on which this patent is based.

GENERAL SYSTEM CONFIGURATION

The multimedia video on demand system of the present invention is illustrated in block diagram form in FIG. 1. As shown in FIG. 1, a video on demand (VOD) server 20 provides video on demand programming services to a plurality of users over a transmission medium 22. The transmission medium 22 may comprise a cable television network, a telephone system, a direct broadcast satellite system, microwave system, fiber optic, and/or radio frequency (RF) system, or a variety of other electronic transmission systems known in the art.

As illustrated in FIG. 1, the transmission medium 22 is coupled to a settop box 24 which comprises an audiovisual transceiver and an infrared (IR) remote receiver 25, as well as other separately identifiable elements, as will be described more fully below. Although the receiver 25 is illustrated as being an IR receiver, it will be appreciated that a variety of other communication systems may be used, including radio, low power cellular and the like. As illustrated, the set top box 24 is coupled to a television 28 having a screen 29, or other audiovisual device such as a video tape recorder (not shown). A remote control input device 30 communicates with the settop box 24 through the IR receiver 25, for the selection of various functions and features of the present invention as described herein. The remote control 30 includes a touch sensitive display 31 which, as will be described, permits a user to operate on the user interface of the present invention. In one embodiment, the touch sensitive display 31 permits a user to control a cursor displayed on the television screen 29 to select objects, features and other functions of the present invention's user interface. Other additional audiovisual devices may be coupled to the television 28, as well as to the settop box 24, such as laser disc players, computers and the like.

Figure 2:
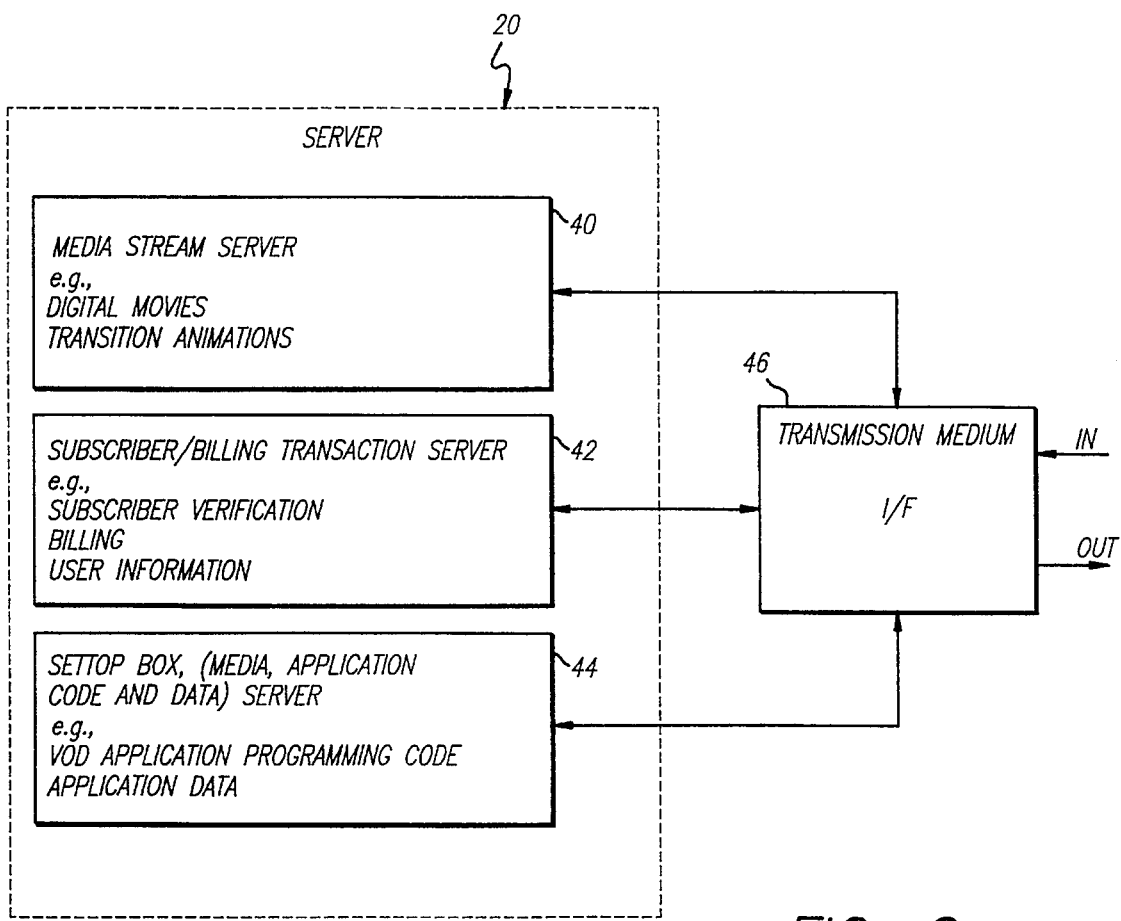
FIG. 2 illustrates a functional information flow diagram for the present invention's video on demand server.

Referring now to FIG. 2, the VOD server 20 includes a number of other subserver systems including a media stream server 40 for providing digitized movies and other programming, as well as any effects such as transition animations which may be generated remotely or by the server 20. Additionally, the server 20 includes a subscriber/billing transaction server 42, which performs necessary subscriber verification, billing, and obtains user information for video on demand as well as other programming. A settop box server 44 executes video on demand application programming code for the system, as well as handles the storage, retrieval, and processing of any necessary application data. As illustrated in FIG. 2, the media stream server 40, the subscriber/billing transaction 42, and the settop box server 44, are coupled to the transmission medium 22 through an interface (I/F) circuit 46.

Figure 3:
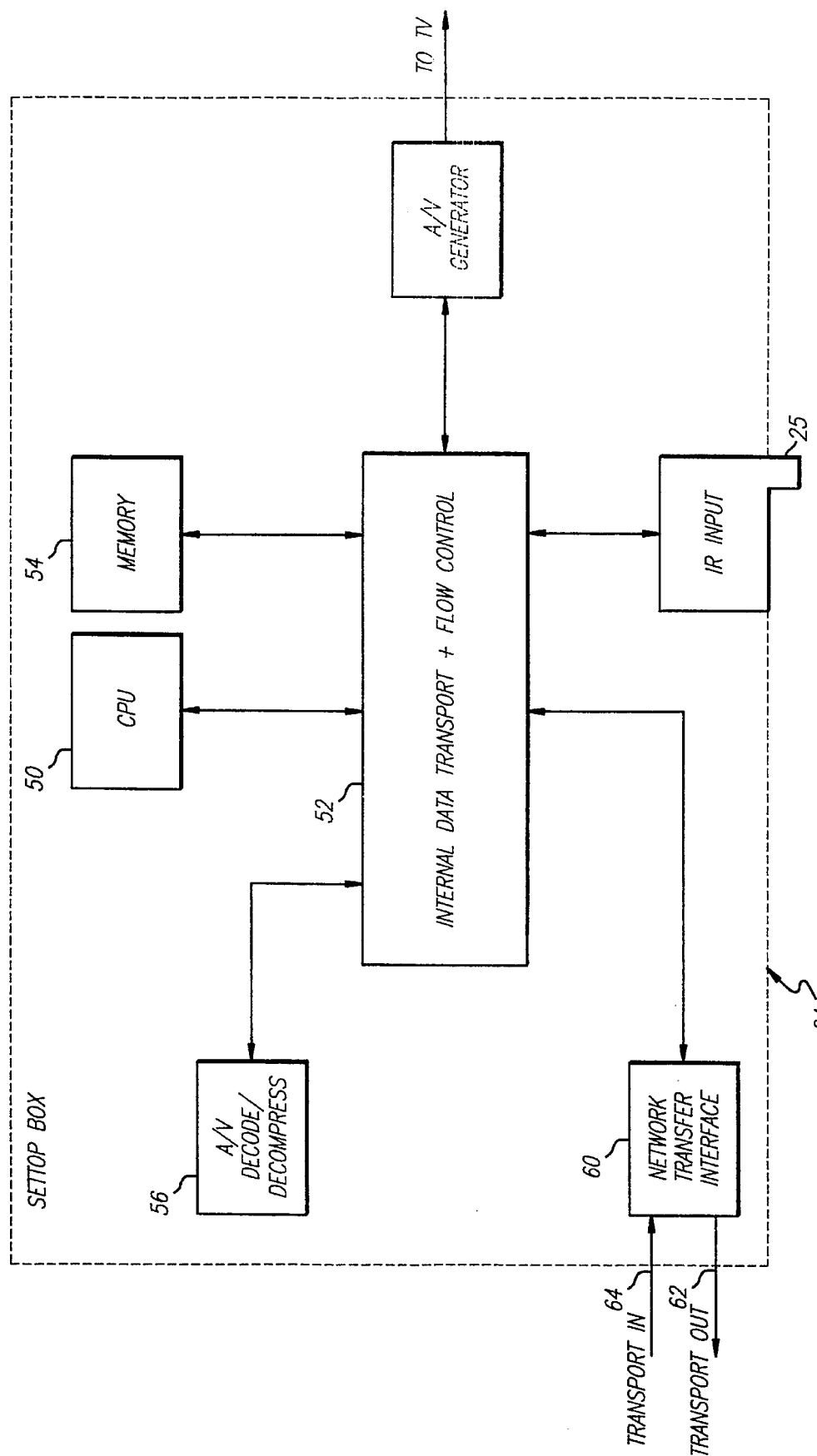
FIG. 3 is a functional block diagram of the present invention's settop , box.

Referring now to FIG. 3, the settop box 24 of the present invention is shown and described in additional detail. The settop box 24 includes a central processing unit (CPU) 50 which is coupled to an internal data transport and flow control system, comprising a system bus or switched memory architecture (referred to generally by the numeral 52). A memory 54 is also coupled to the internal data transport and flow control system 52, as is an audiovisual (A/V) decode/decompressor 56. The memory 54 stores programming code and other data required by the CPU 50 to generate the user interface of the present invention, and execute the various functions described herein. As shown, the IR input circuit 25 is also coupled to the internal data transport and flow control system 52, as is a network transfer interface circuit 60. The network transfer interface circuit 60 controls the transport in and out of video on demand data and programming information through to the settop box 24 from the VOD server 20. The transport out path 62 represents a back channel in which user selections on the interface of the present invention may be communicated to the VOD server 20. Similarly, downloaded video and other data is provided over a transport in path 64 to the network transfer interface 60 of the settop box 24. Additional tuners, demodulators and the like are not shown in FIG. 3, but are contemplated to be included in the settop box 24 to read and display data from the VOD server 20. These additional devices include circuitry for providing picture in picture (PIP) windows, as well as descrambling circuitry to descramble downloaded video data from the VOD server 20 received by the settop box 24.

In operation, one of the first tasks in utilizing the system illustrated in FIG. 1, is for the subscriber to log on and be verified as an authorized user of the video on demand/ interactive television system. The specific process and/or protocol for verifying subscriber information is not described in the Specification, but it is contemplated that a variety of different subscriber verification protocols including public/private key encryption, may be utilized to support the verification process. Once the subscriber is verified, the server 20 transmits a log-in acknowledgment to the settop box 24, along with an authentication key which permits the subscriber to access the VOD server 20. Moreover, it is contemplated that a hierarchy will be provided by the present invention for queries that a user may initiate once authentication of the user is accomplished. For example, the user may obtain category information from the VOD server 20. The category information may represent, for example, a "Top 10" listing of user video preferences. Additionally, catalog information may be obtained from the VOD server 20 which may represent, for example videos matching a particular category search initiated by the user, as well as information on specific video selections.

As will be described, through the use of the present invention's user interface, various functions may be selected such as start, stop, pause, intermission, and resume of a movie, and such command data is coupled by the settop box 24 over the transport out channel out 62 to the VOD server 20. As the user navigates through the user interface of the present invention, various application programming code and data is provided by the VOD server 20 to the CPU 50 of the set top box 24, for display on television 28.

VIDEO ON DEMAND GRAPHIC INTERFACE

The following detailed description of the current preferred embodiment of the invention refers to, and incorporates fully, the copending Parent patent application. Additionally, with respect to that portion of the present invention which relates to the user interface, the reader is referred to the video tape entitled "Video On Demand Graphic User Interface" (hereinafter sometimes referred to as "the videotape"), submitted concurrent with the filing of the application on which this patent is based, to assist the reader in understanding the present invention as disclosed herein.

Most popular graphic user interfaces that are available, such as the Xerox Star®, Apple Macintosh®, and Microsoft Windows® are based upon the "desk top metaphor". In a desk top metaphor system, the display screen is treated as a virtual desktop. Graphical symbols placed on the virtual desktop are used to represent common objects found in an office environment, such as files, file folders, and printers.

Figure 4:
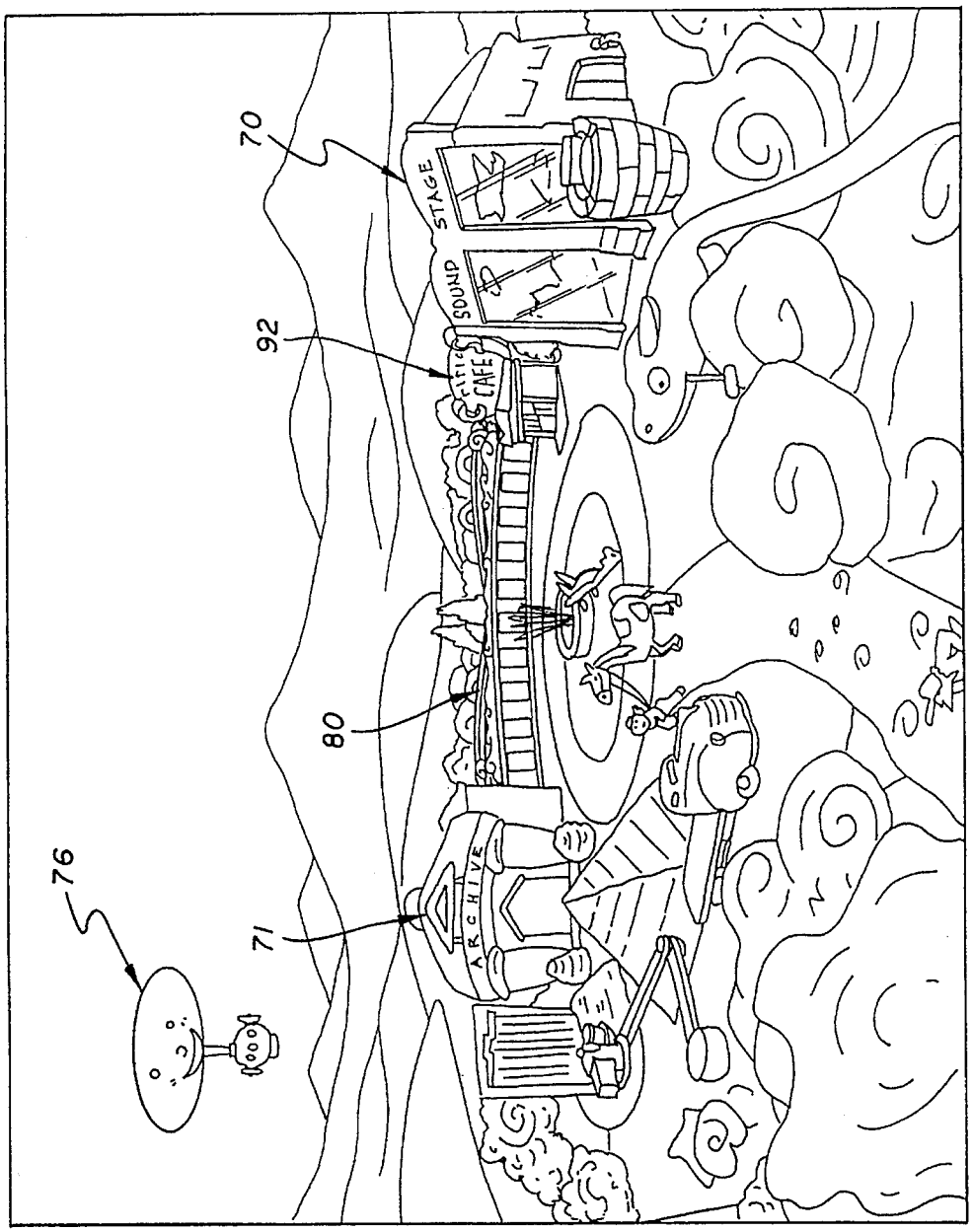
FIG. 4 illustrates an overview of the present invention's studio back lot graphic user interface metaphor.

The user interface environment of the present invention utilizes a "movie studio back lot metaphor", which, as illustrated in FIG. 4 presents the user with a virtual world of a movie studio back lot. The interface design provides an animated three dimensional view through the gates of a back lot entitled "Moviewood". As shown in FIG. 4, the back lot studio metaphor of the present invention includes a "bird's eye view" of a center square of a studio back lot. The metaphor includes a variety of Spaces surrounding the studio back lot. For example, the Spaces shown in FIG. 4 include, an indoor sound stage 70, a Poster wall 80 displaying Posters of currently available movies, a film archive 71, and a blimp 76 are displayed. As illustrated in FIG. 4 and the videotape, various movie characters and animated objects are moving throughout the interface of the present invention. Some of the animated characters and objects are carrying sets, riding bicycles, etc.

In the presently preferred embodiment of the invention, remote 30 includes a touch sensitive screen 31 to permit the subscriber to touch various displayed objects and characters on the graphic user interface shown in FIG. 4. As will be described, many of the objects and characters displayed in the present invention's studio back lot metaphor perform a function when touched by the user. Various Spaces, Objects, Data Objects, Buttons, Portals (including a Wayback Portal) and Agents, are provided in the user interface of the present invention as illustrated in FIG. 4, and first initially disclosed and hereby incorporated from the Parent application.

Figure 5:
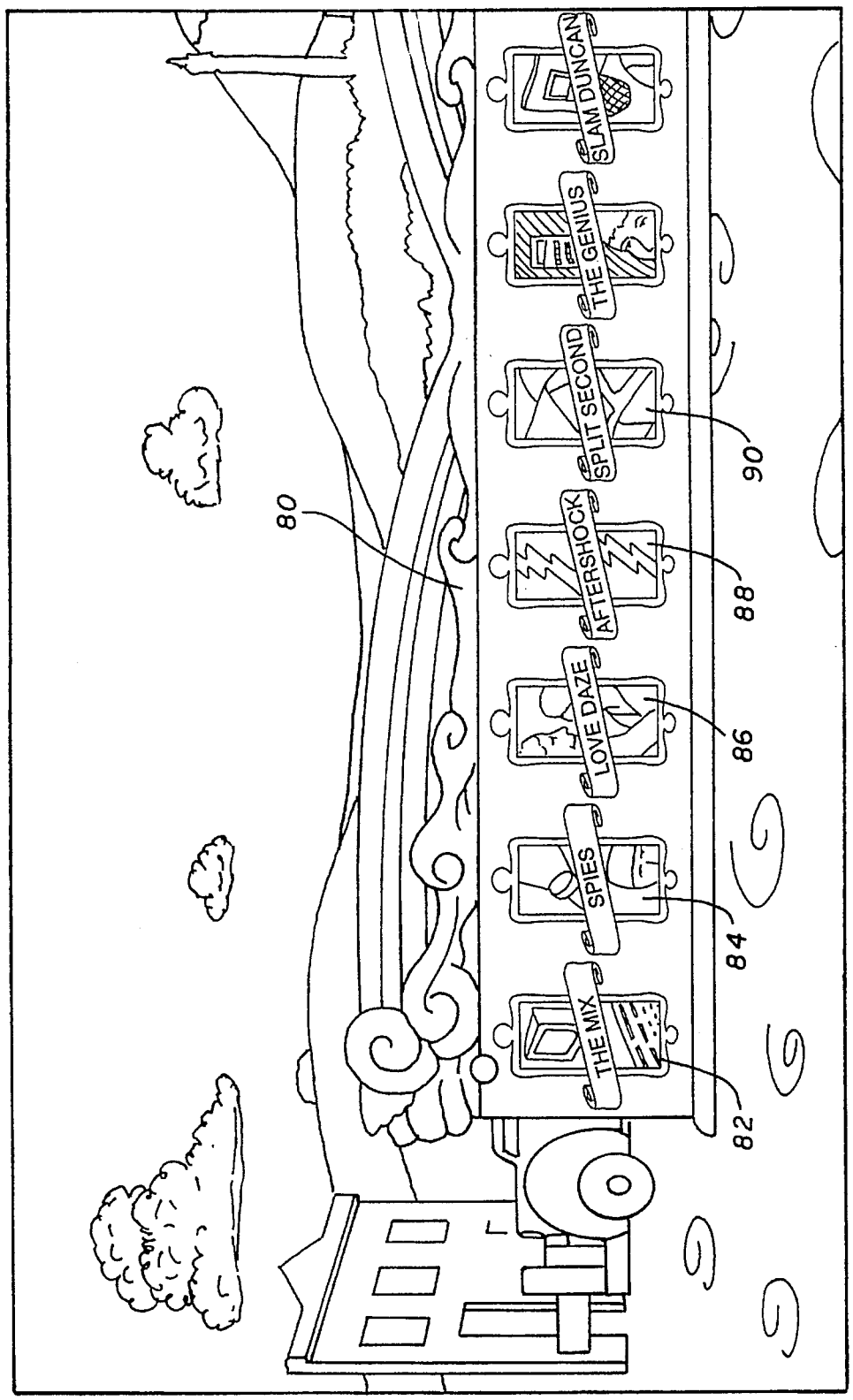
FIG. 5 illustrates the present invention's Poster wall for the display of available video on demand selections.

Referring now to FIG. 5, the present invention's user interface includes a Poster wall 80, which, as will be described, presents to the user a series of movie Posters, such as for example movie Posters 82, 84, 86, 88, and 90. Each of the movie Posters represents an available video selection to the user which may, for example, comprise the "Top 10" video rentals for the week, or perhaps the newest movies which are available for downloading and viewing from the video on demand server 20. It will be appreciated that the particular movies (herein the terms "movies" and "videos" are used interchangeably) displayed on the Poster wall 80 may represent movies in certain categories, specific user preferred movies, or may be arranged in other desired configurations on the Poster wall 80.

The present invention permits a user to Pan in at least two directions, and thereby navigate through the movie studio back lot interface. In one embodiment of the present invention, panning is accomplished within the user interface by placing a finger on the screen 31, and moving the finger in the opposite direction the user wishes to move. The CPU 50 responds to the user's finger motion by generating a "Panning active" sound, and moving the background image of the user interface on the screen in the opposite direction of the finger's movement, thereby bringing other objects into view. In the present embodiment, it is contemplated that a user may Pan a full 360 degrees, and that in other embodiments, the user may Pan in an up or down direction as well. The reader is referred to the Parent application for a further description of the present invention's Panning gestures for navigating through the interface.

Figure 6:
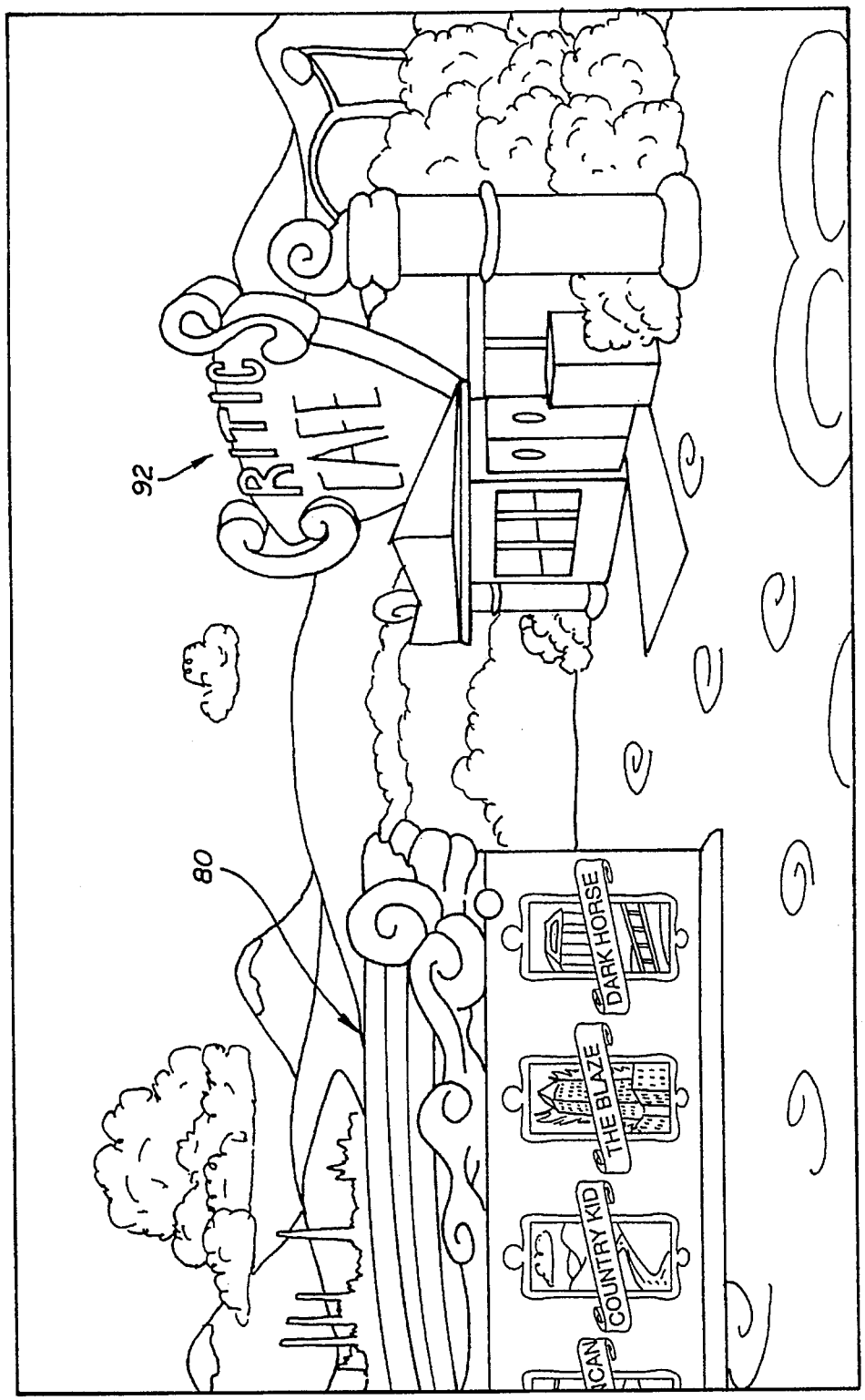
FIG. 6 illustrates the user panning feature of the interface of the present invention to navigate within the studio back lot metaphor.

Assume for the sake of example that a user desires to Pan to the right of the Poster wall 80 illustrated in FIG. 5. The user operates the remote control 30 and using the touch sensitive screen 31, moves his finger to the left on screen 31, thereby Panning to the right. As shown in FIG. 6, as the user Pans to the right relative to the position of the user with respect to the screen 29, an additional Space is displayed entitled the "Critic's Cafe" 92. By touching, or otherwise selecting, the Critic's Cafe 92 using the remote control 30, the interior of the Critic's Cafe is displayed (not shown) along with other objects which may be selected. Although the present invention is described with reference to a remote control 30 for the selection of objects and navigation through the present invention's user interface, it will be appreciated by one skilled in the art that a variety of other selection methods and devices may be utilized to accomplish the same result. For example, it is contemplated that the remote control 30 (see FIG. 1) may utilize a joystick instead of the screen 31 for navigation and selection.

Figure 7:
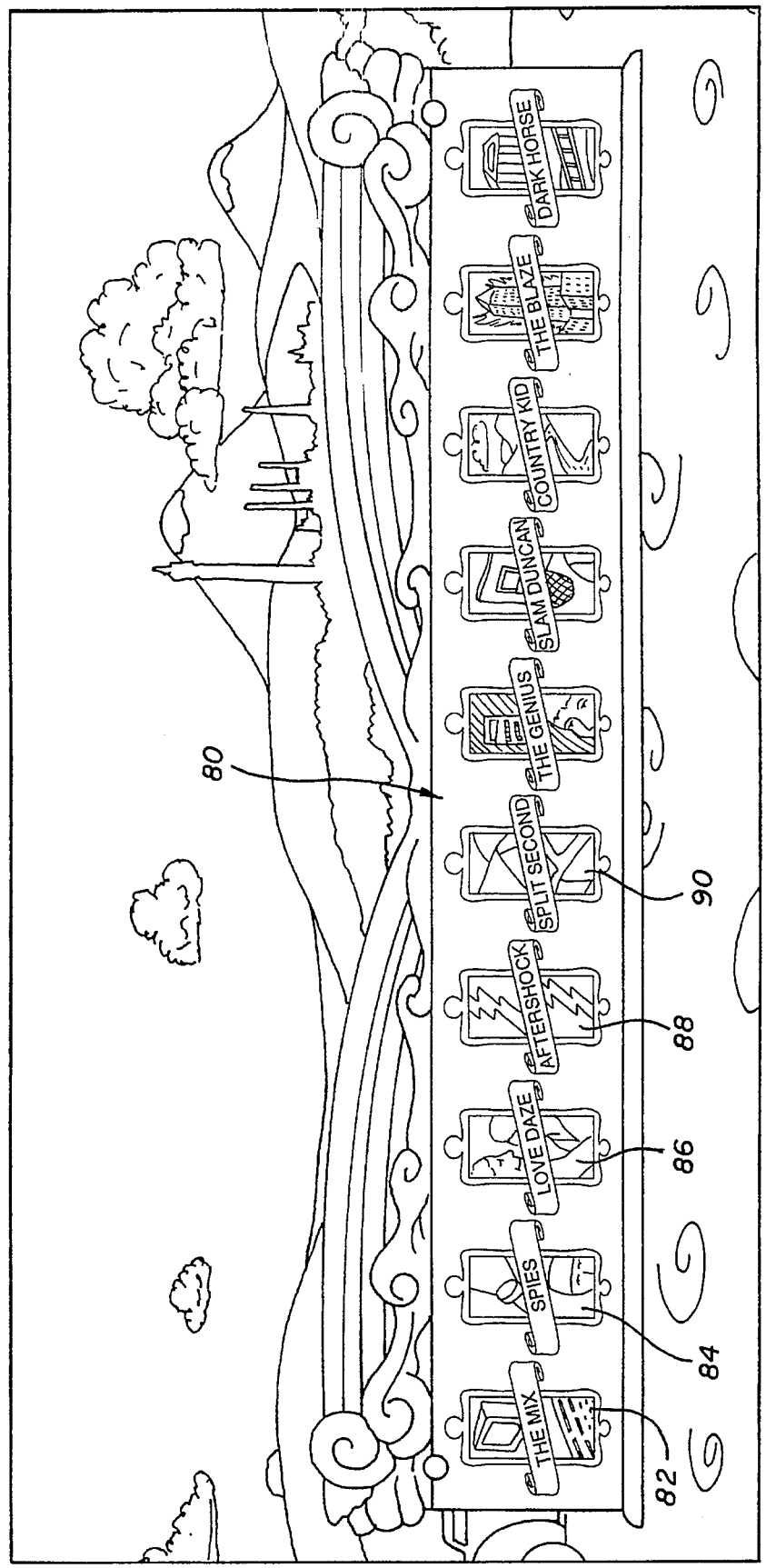
FIG. 7 illustrates the Poster wall of the present invention for the display of available video on demand selections.
Figure 14B:
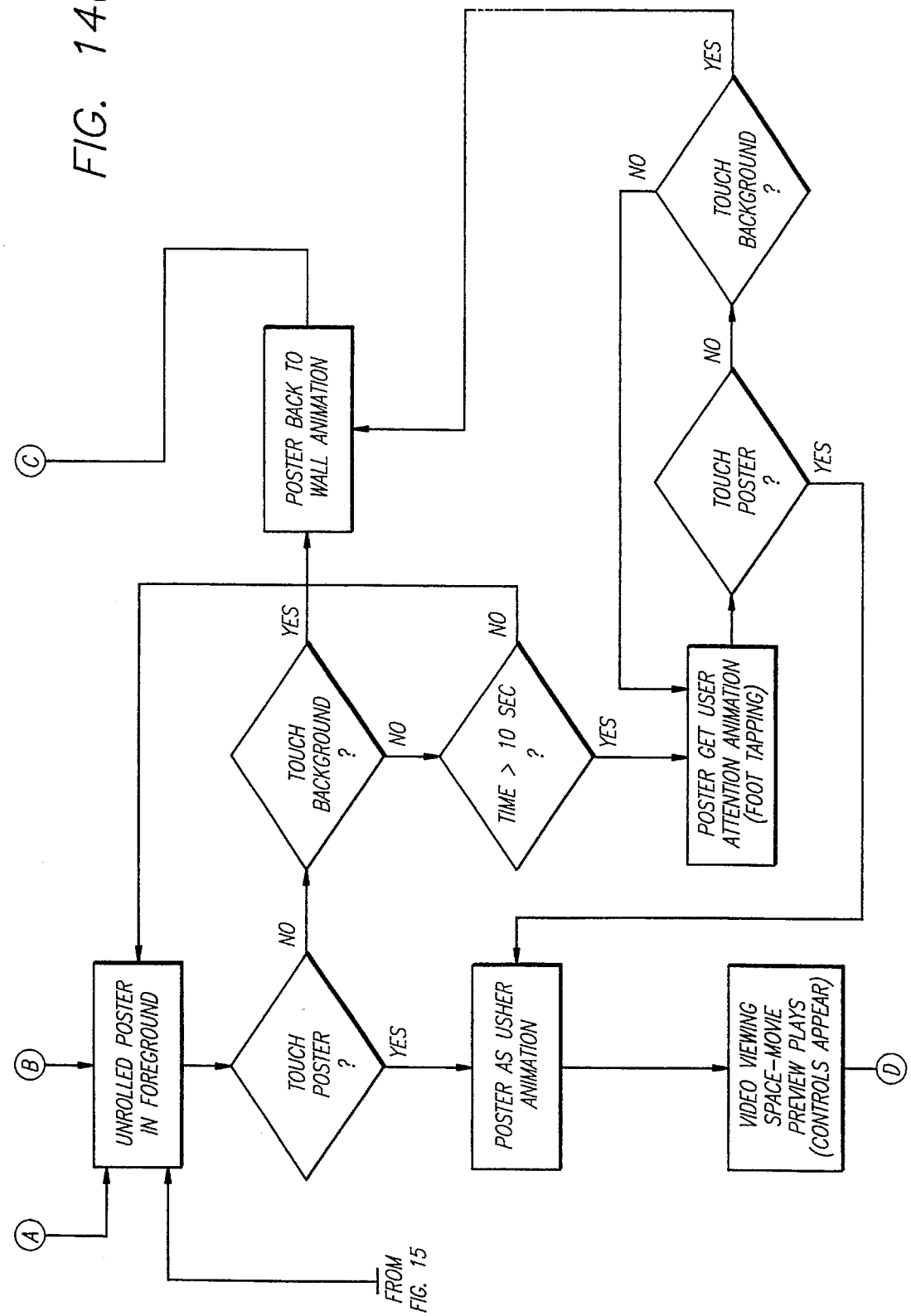
Figure 14C:
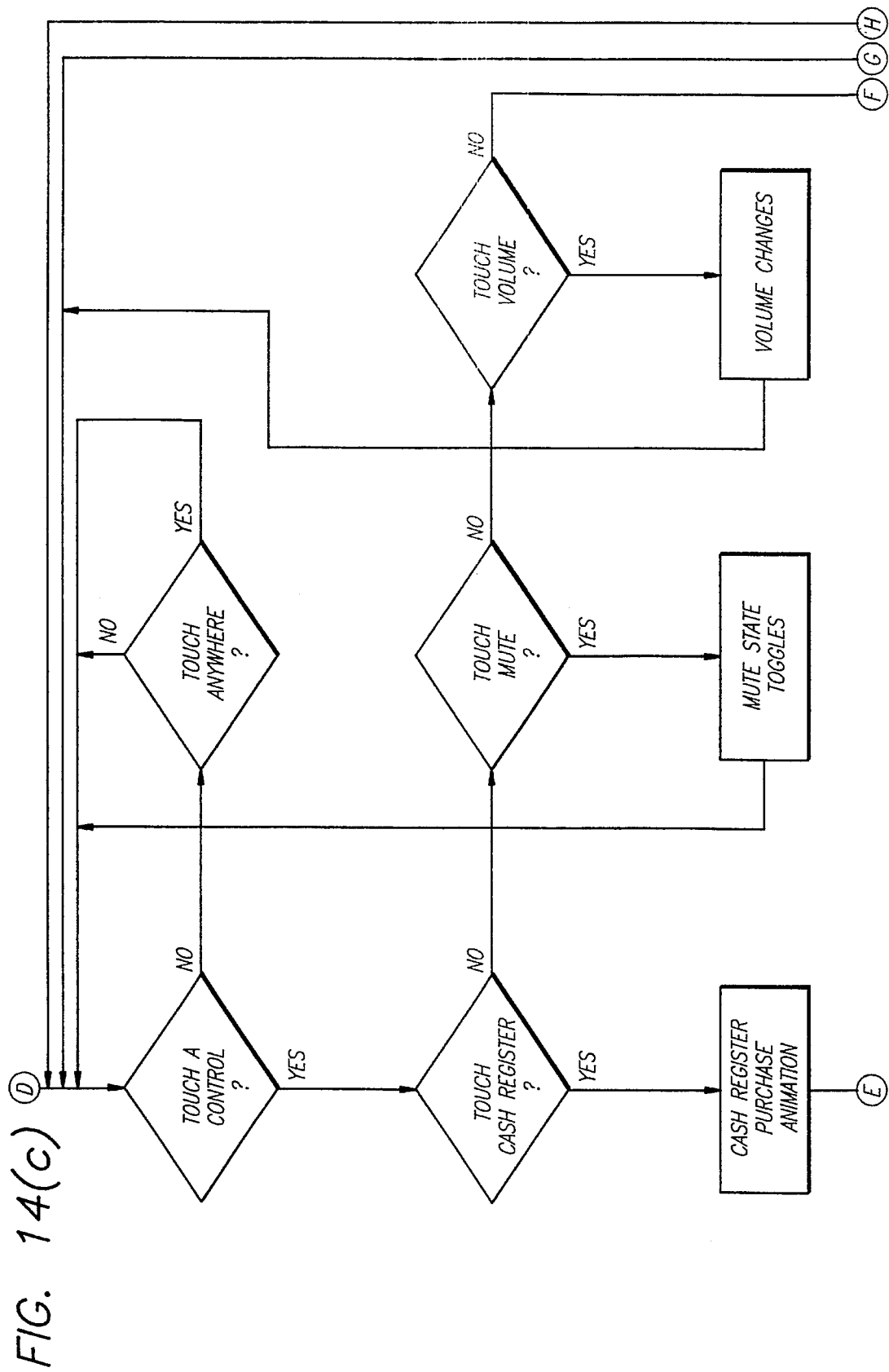
FIGS. 14(c), 14(d) and 14(e) are flow charts illustrating the operation of the present invention for controlling user activated functions during the showing of a selected video or other audiovisual program.
Figure 14D:
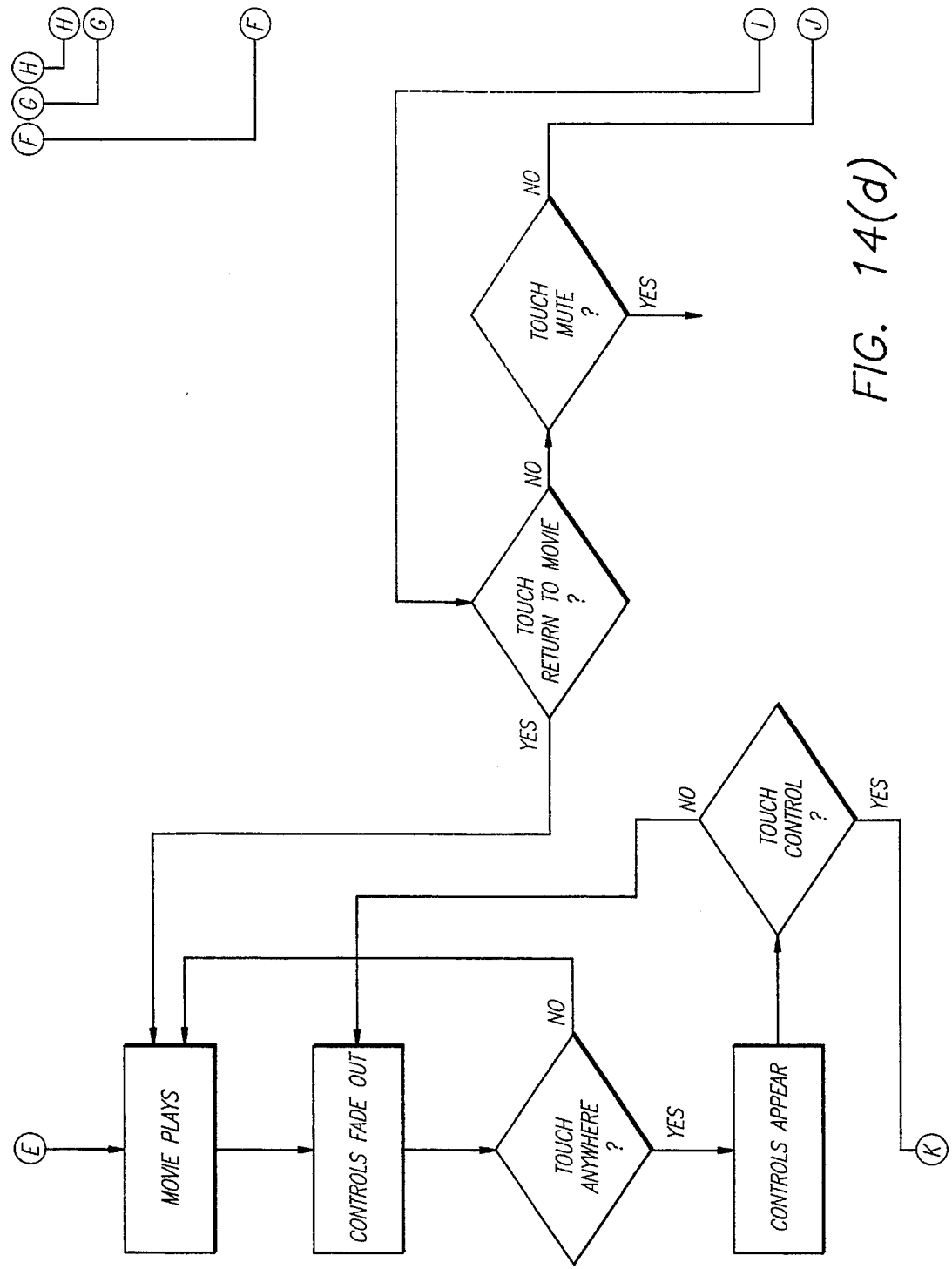
Figure 14E:
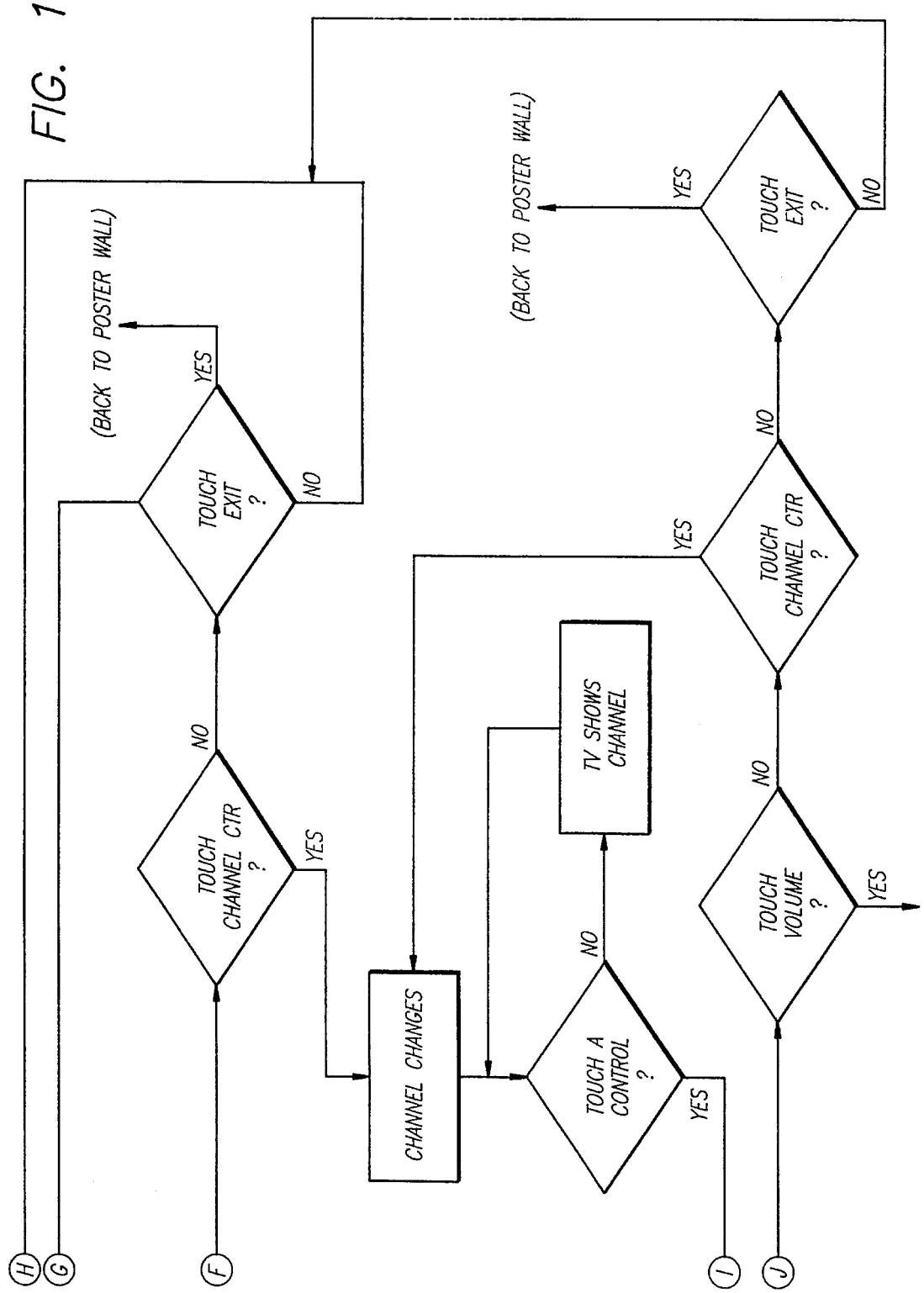
Figure 14F:
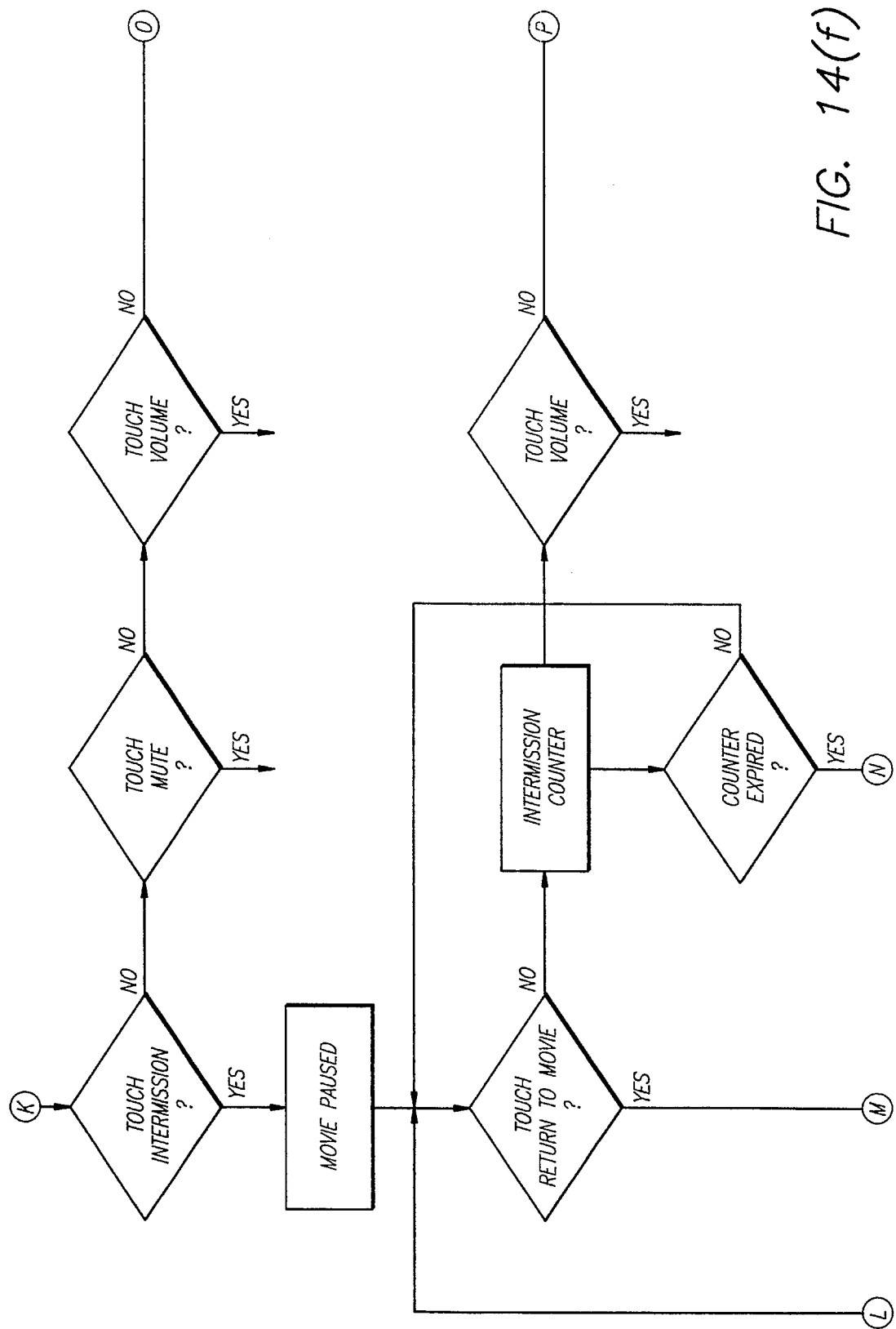
FIGS. 14(f), 14(g), 14(h) and 14(i) are continuation of the flow charts illustrated in FIGS. 14(a) through 14(e), further illustrating the operation of the present invention for the selection of intermission and other control functions.
Figure 14G:
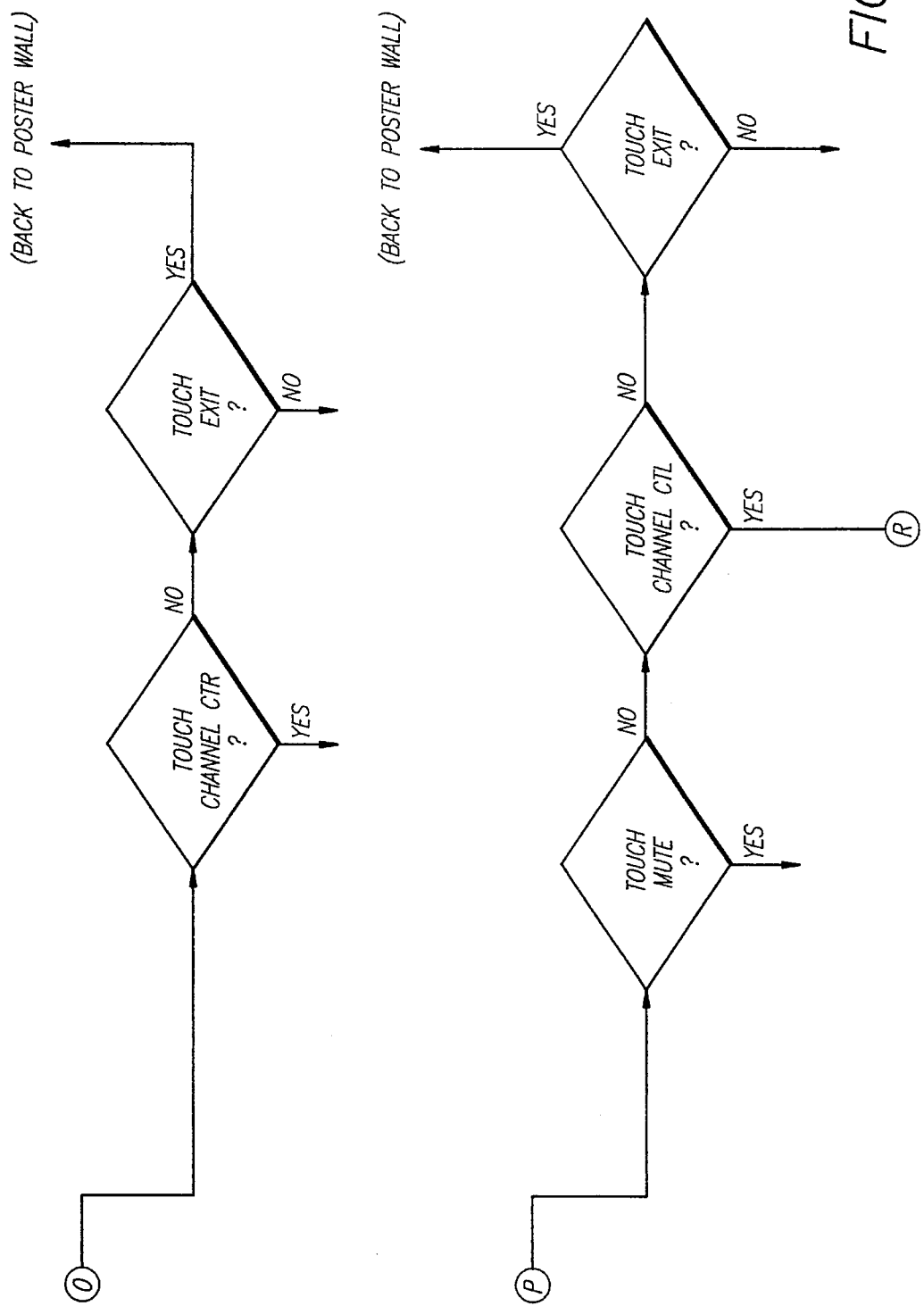
Figure 14H:
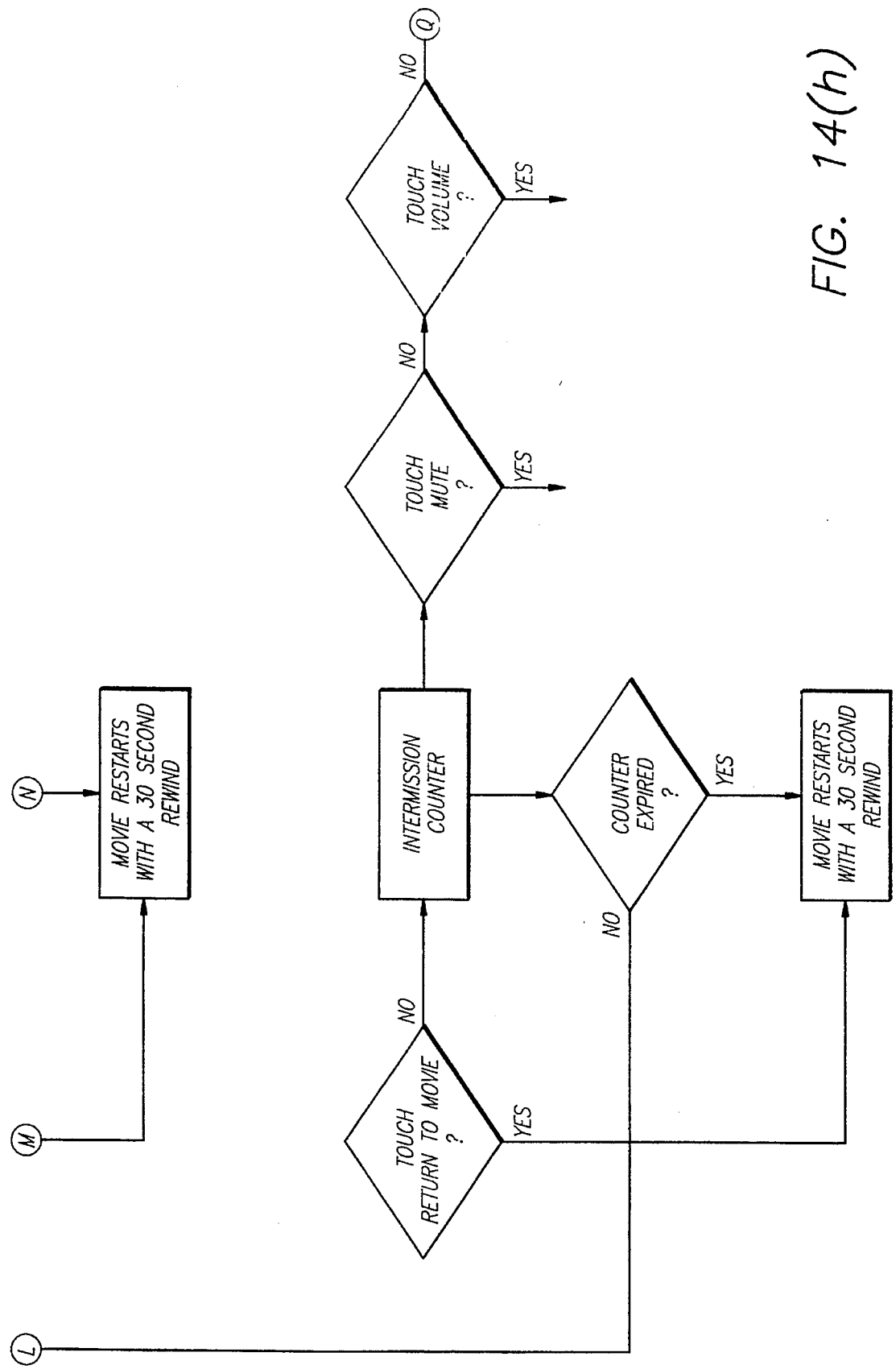
Figure 14I:
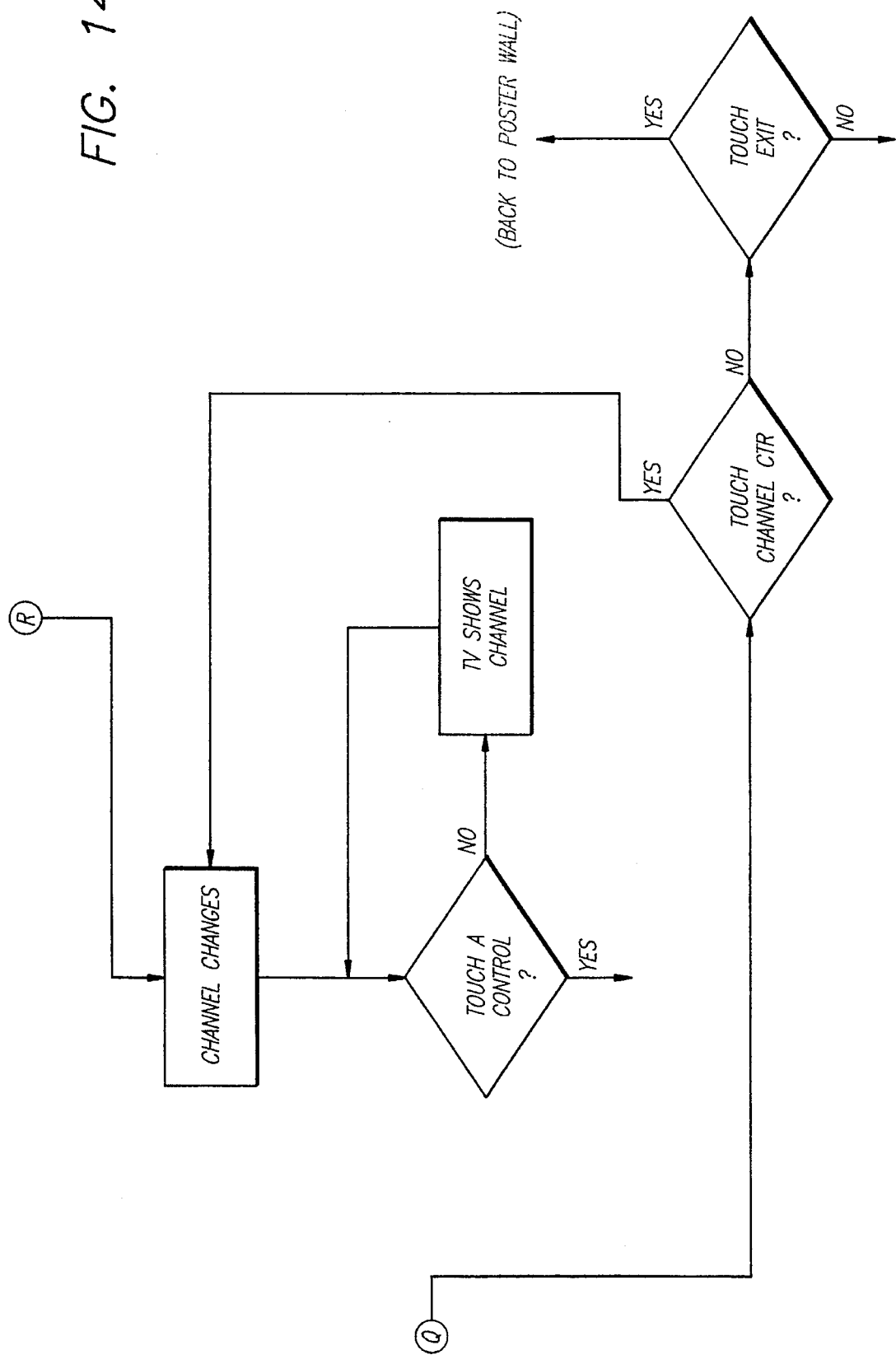

Referring now to FIG. 7 in conjunction with the flowcharts of FIGS. 14(a) through 14(c), the present invention's method and apparatus for the selection of video on demand movies and other programming services will be disclosed. As previously described, the Poster wall 80 displays a pre-defined number of "Posters" of available movies (or other programs) which may be selected and viewed by the user. When a user touches a Poster, for example Poster 90, on the Poster wall 80, the CPU 50 senses the user selection and generates an animation which displays the Poster coming off of the wall and appearing in the foreground. The purpose of the Poster moving to the foreground is to permit users to obtain more information about the video, before deciding whether or not to rent or otherwise order the video from the VOD server 20.

It is anticipated that a regular user of the present invention may desire to select movies without triggering the Poster opening animation, thereby saving time. Thus, in accordance with the presently preferred embodiment of the invention, after a user interacts with the Poster wall 80 more than three times, the longer animation sequence is no longer activated by the CPU 50 when a Poster is touched, but rather, a shorter animation is activated, and the Poster simply leaps into the foreground.

Figure 8:
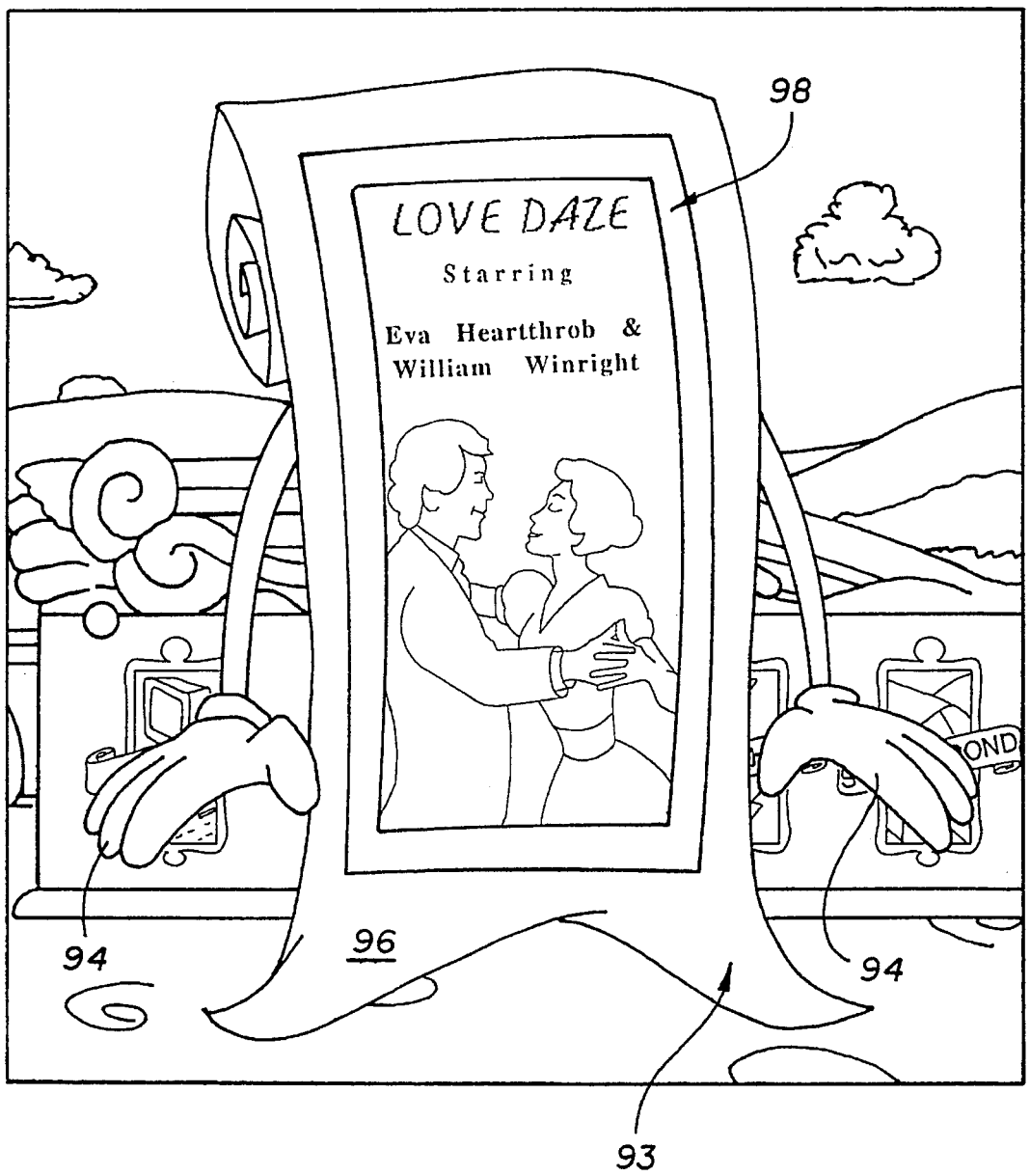
FIG. 8 illustrates a Poster Agent which is displayed upon a user's selection of one of the movie selections displayed on the Poster wall.

As provided in the flow charts of FIG. 14, when a Poster on the Poster wall 80 is touched, an animation is triggered. The Poster animation sequence of the present invention makes the Poster have the appearance of jumping off the Poster wall, moving to the foreground and unfurling as illustrated in FIG. 8. As shown in FIG. 8, an unfurled Poster 93 appears in a cartoon-like animated form having hands 94, a Poster body 96, and a Poster information area 98. Poster information area 98 is provided for the display of information related to a particular movie or other programming available for selection by the user. In the present embodiment, information presented within the Poster information area 98 appears to the user as a movie poster advertisement, similar to that provided in a newspaper, magazine or at a movie theater. As set forth in the flow chart in FIGS. 14(a)–14(i), if subsequent to the display of Poster 93 the user touches another area of the user interface, such as the background, Poster 93 appears to snap back onto the Poster wall 80, with the user continuing to view the Poster wall as shown in FIG. 7.

Figure 9:
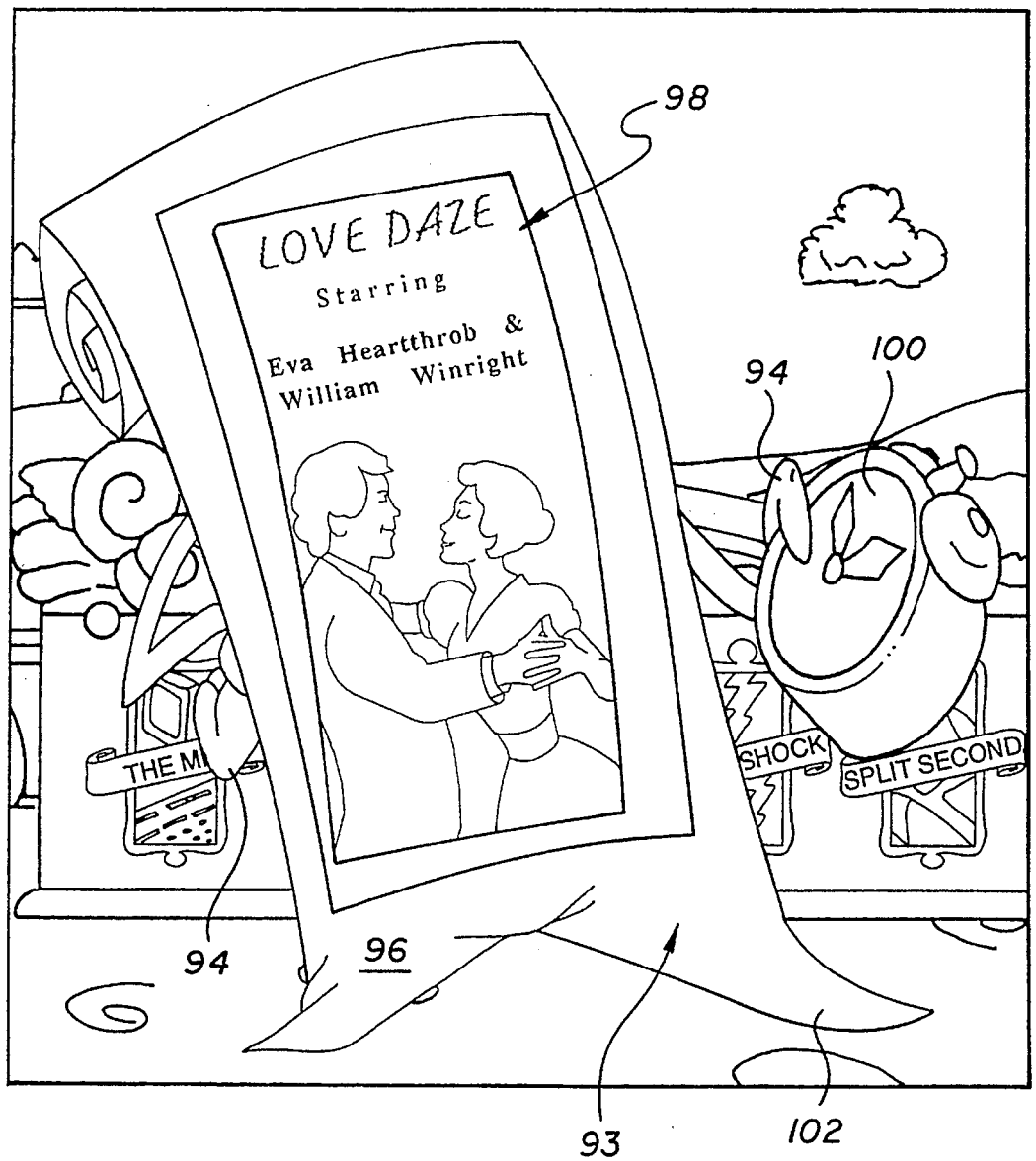
FIG. 9 illustrates the Poster Agent holding an alarm clock in an animated sequence in the event a user does not select or dismiss the Agent within a predetermined time.

Similarly, if after the selection of a Poster 93 and its display in the foreground, a user takes no further action by either touching Poster 93 or the background, the Poster, in an animated form, appears to hold a clock 100 and begins tapping its "foot" 102 as illustrated in FIG. 9 and provided in flow chart form in FIGS. 14(a)–14(e). The foot tapping animation is intended to communicate to the user that the Poster 93 was activated, and that some action is necessary in order to proceed with the selection of the desired movie or other programming. In the present embodiment, the animated foot tapping of the Poster 93 continues to be displayed until either the Poster 93, or the background, is touched. It will be appreciated that other possible animations may be used by Poster 93 to remind the user that some action is necessary to proceed with the selection of a movie.

In the event a user touches the Poster 93 (utilizing, for example, the remote control 30) the present invention then displays a video viewing space, as will be described with reference to the flow chart of FIGS. 14(b)–14(i).

Figure 10:
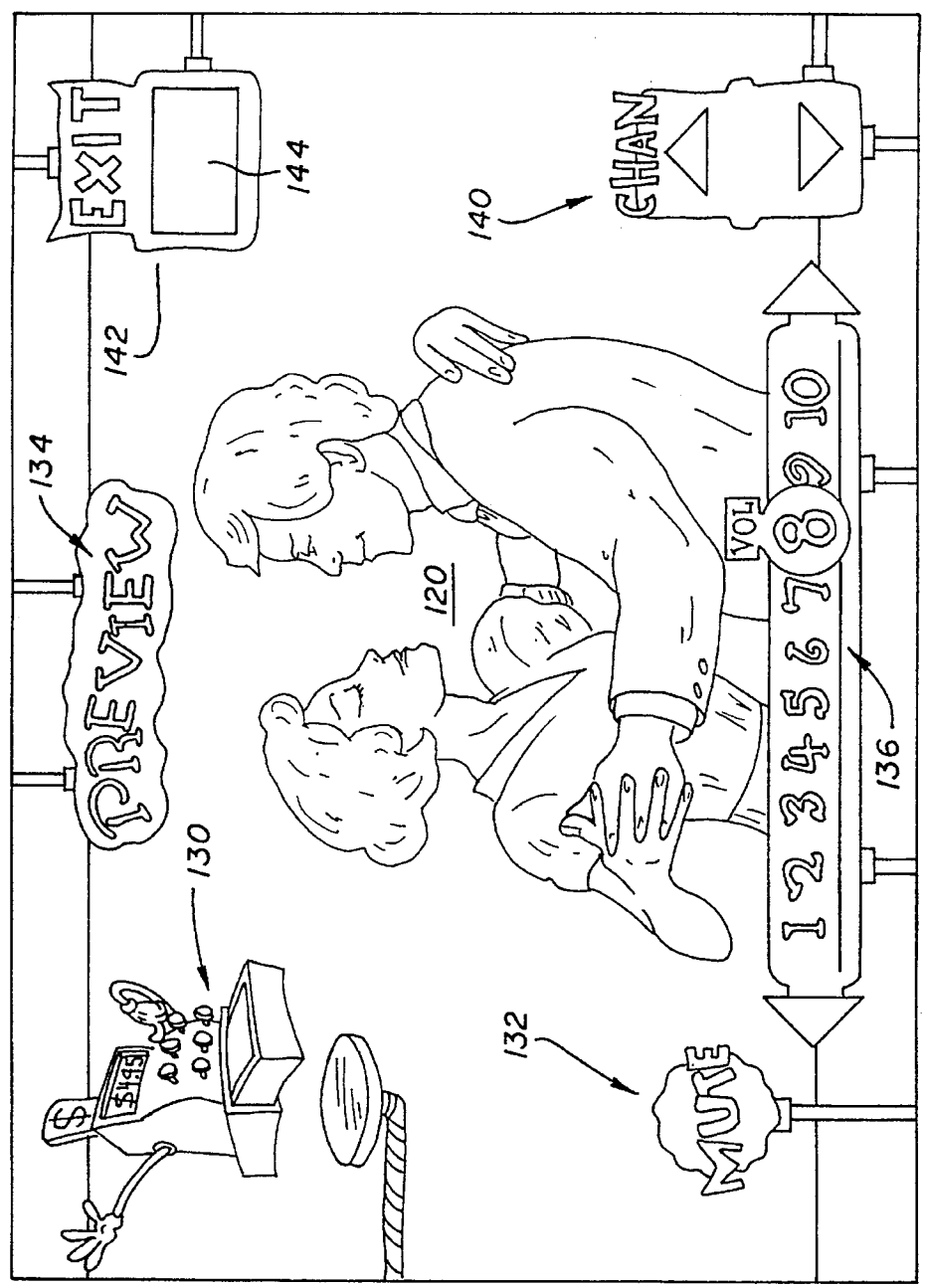
FIG. 10 illustrates the video viewing space of the user interface of the present invention for the display of a movie preview upon the selection of the Poster Agent illustrated in FIGS. 8 and 9.

Upon the selection of the Poster 93, the CPU 50, executing programming stored in the memory 54, displays a video viewing space 120 diagrammatically illustrated in FIG. 10. The video viewing space represents a Space for the control of the television 28, watching television programming, movies, movie previews, and the like. Overlaying the video displayed within the video viewing space 120 are a variety of Space control functions, which, after a pre-determined amount of time fade from view. In the present embodiment, touching the screen 31, of the remote control 30, results in the CPU 50 re-displaying the controls. The controls represent objects which comprise individual graphical function icons, that are rendered on the user interface of the present invention by the CPU 50. As provided in the Parent application on which this application is based, each control function is an object-oriented programming type of object containing data methods which can be invoked to act on the data. For example, a cash register button function 130 is displayed to permit a user to "purchase" the selected movie. Touching, or otherwise activating, the cash register function 130 results in a "ring-up sale" animation, the termination of any currently displayed preview of the selected movie, and the initiation of the viewing of the feature movie selected. Upon final selection of the movie by activating the cash register function 130, the server 20 downloads the selected video to the settop box 24 for display on the television 28.

As illustrated in FIG. 10, additional controls displayed on the interface of the present invention include a mute button function control 132 for muting the sound of the currently displayed programming. Similarly, a preview notice 134 is provided to indicate that the currently displayed programming constitutes a preview rather than a feature presentation.

A volume control 136 permits the user to adjust the audio volume utilizing the remote control 30. An up-down channel control 140 permits the user to change channels of the television 28 when a user is viewing television programming.

An exit control 142 is similar to the Wayback portal disclosed in the Parent application. As shown, the exit control 142 consists of an exit sign with a small rectangular frame 144 which encloses a snapshot of the previous Space from which the user has traveled from within the studio back lot metaphor. For example, if a user has moved from the Poster wall 80 to the video viewing space 120, the rectangular frame 144 will display Poster wall 80. By touching, or otherwise activating the exit function 142, the user may move through this exit Wayback portal to the position facing the Poster wall 80, and exiting the video viewing space 120. In the presently preferred embodiment, the selection of exit 142 cancels the currently-viewed movie, however, it is contemplated that a user may, as in the case of a real life theater, exit the movie to perform some function (for example answering the phone), and then return to the movie still in progress. Reference is made to the flow charts of FIGS. 14(*a*)–14(*i*) for a detailed description of the operation and function of the controls illustrated in FIG. 10, and the resulting operations by the CPU 50 of the settop box 24.

Figure 11:
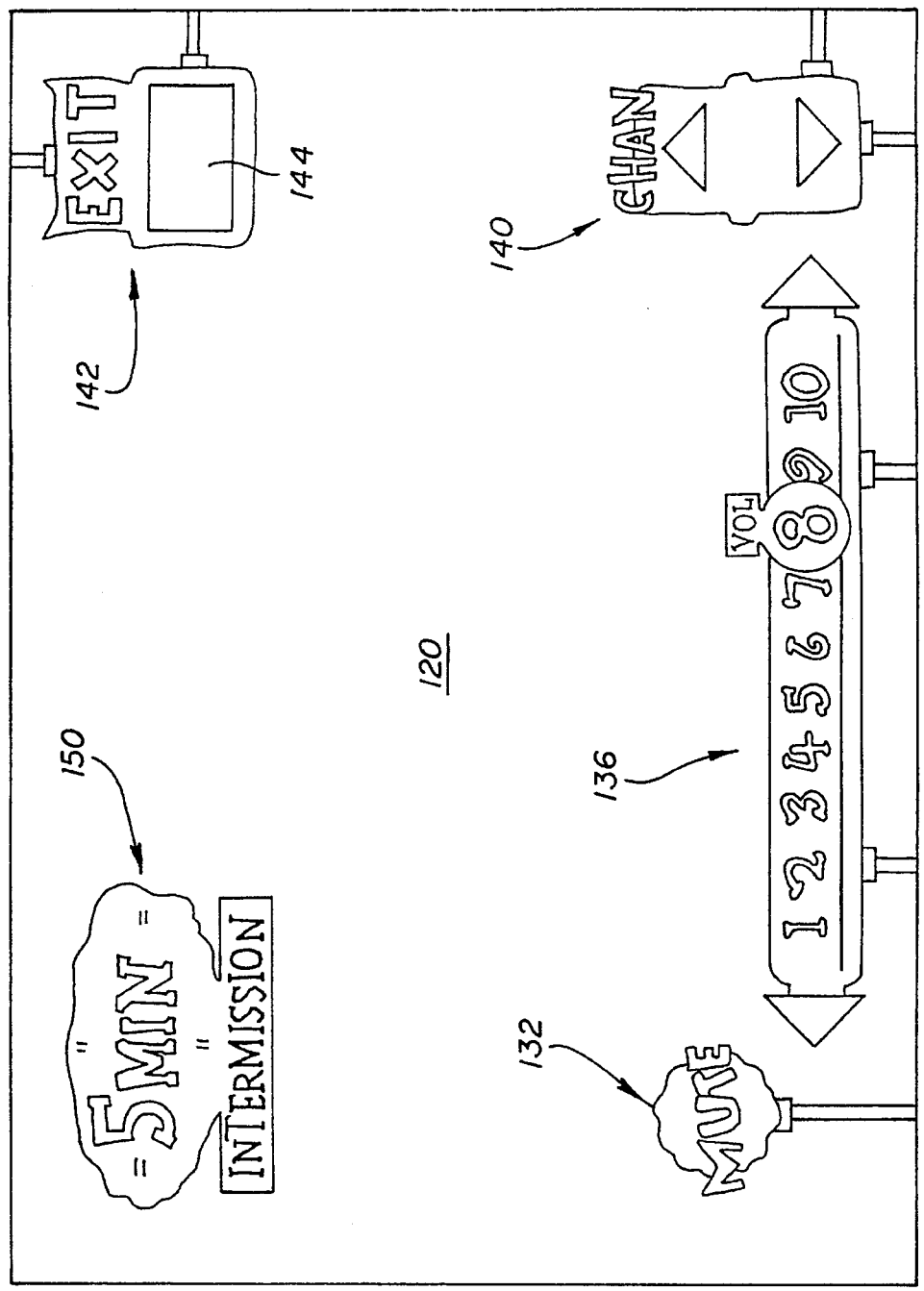
FIG. 11 illustrates the video viewing space of the present invention in which controls are provided for user operation during the showing of a video on demand movie, including an intermission control function.

Referring now to FIG. 11, once the user has selected a video on demand movie from the VOD server 20, CPU 50 downloads the selected video programming over the medium 22 to the settop box 24 for viewing on the television 28, as described above. The graphic user interface of the present invention is modified as illustrated in FIG. 11, and described in the flow charts of FIGS. 14(*a*)–14(*i*). More particularly, the cash register 130 is replaced with a five minute intermission control button 150. The selection of the intermission control button 150 by the user results in the currently viewed feature presentation being paused and an intermission being interjected.

Figure 12:
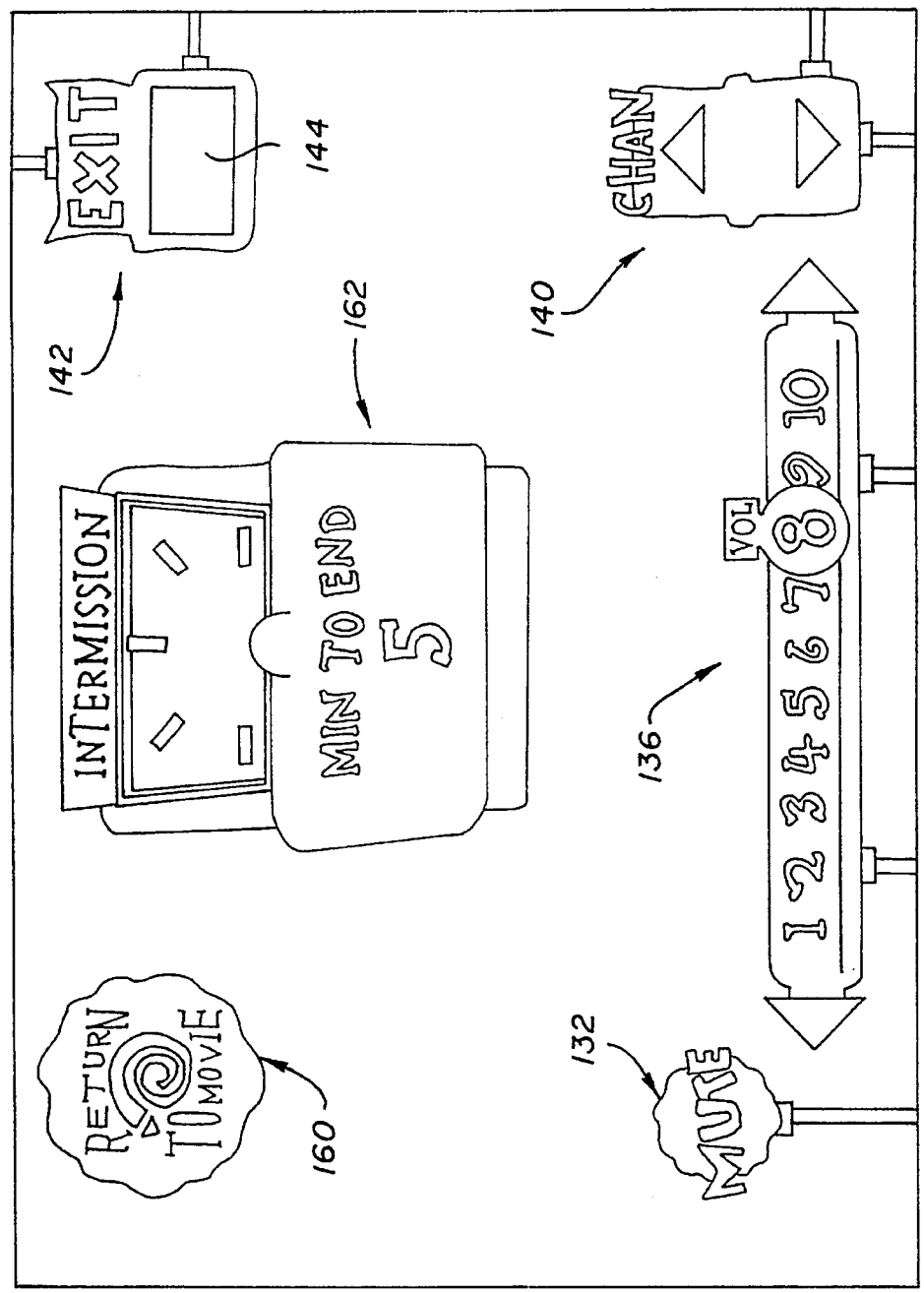
FIG. 12 illustrates the video viewing of the present invention in the event a user selects the movie intermission control function illustrated in FIG. 11

As illustrated in FIG. 12, if a user during the viewing of a movie selects a channel using the up-down channel control 140, the intermission control button 150 is replaced by a return to movie button function 160 as shown in FIG. 12. The user may activate the return to movie function 160, and the CPU 50 of the settop box 24 resumes the display of the selected movie or other programming. Also, as illustrated in FIG. 12, an intermission countdown clock 162 is displayed in the video viewing space 120 and identifies in a countdown fashion how much time is left in the current intermission cycle. If a user activates the channel change function 140 during an intermission cycle, countdown clock 162 remains visible as well as the return to movie control function 160. Thus, during an intermission a user may view programs from a cable television or other source, and select the channels using the channel change function 140.

It will be appreciated by one skilled in the art that the various objects and control functions illustrated in FIGS. 10, 11 and 12 are adaptable to other graphic user interface designs, and may be interchanged, substituted and supplemented dependent upon the particular user interface application. The reader is referred to the flowcharts illustrated in FIG. 14(*a*)–14(*i*) for a detailed operational description of the present invention intermission and return to movie control functions as described above.

Figure 13:
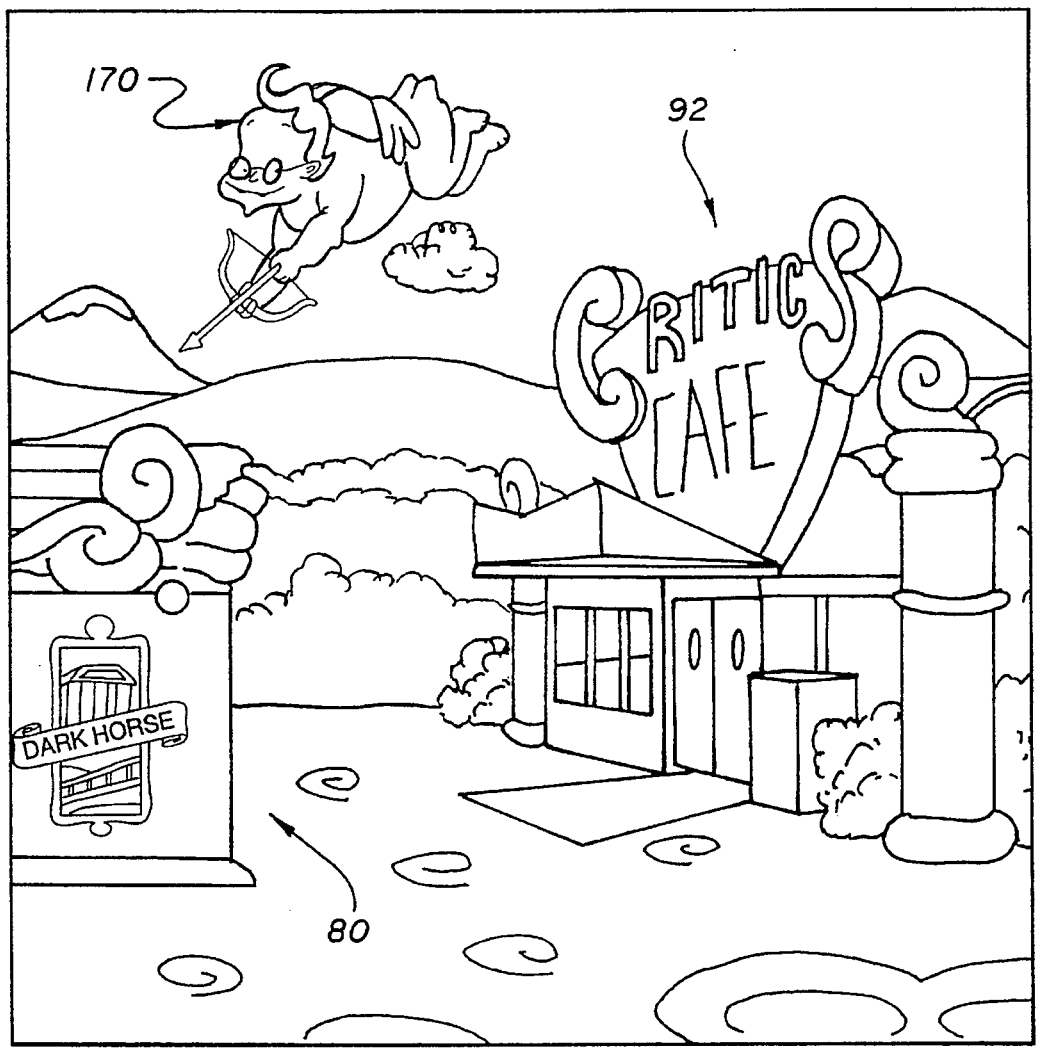
FIG. 13 illustrates one example of the present invention's use of "Extras", which upon selection by a user, provide additional information on other selections available by a user.
Figure 15:
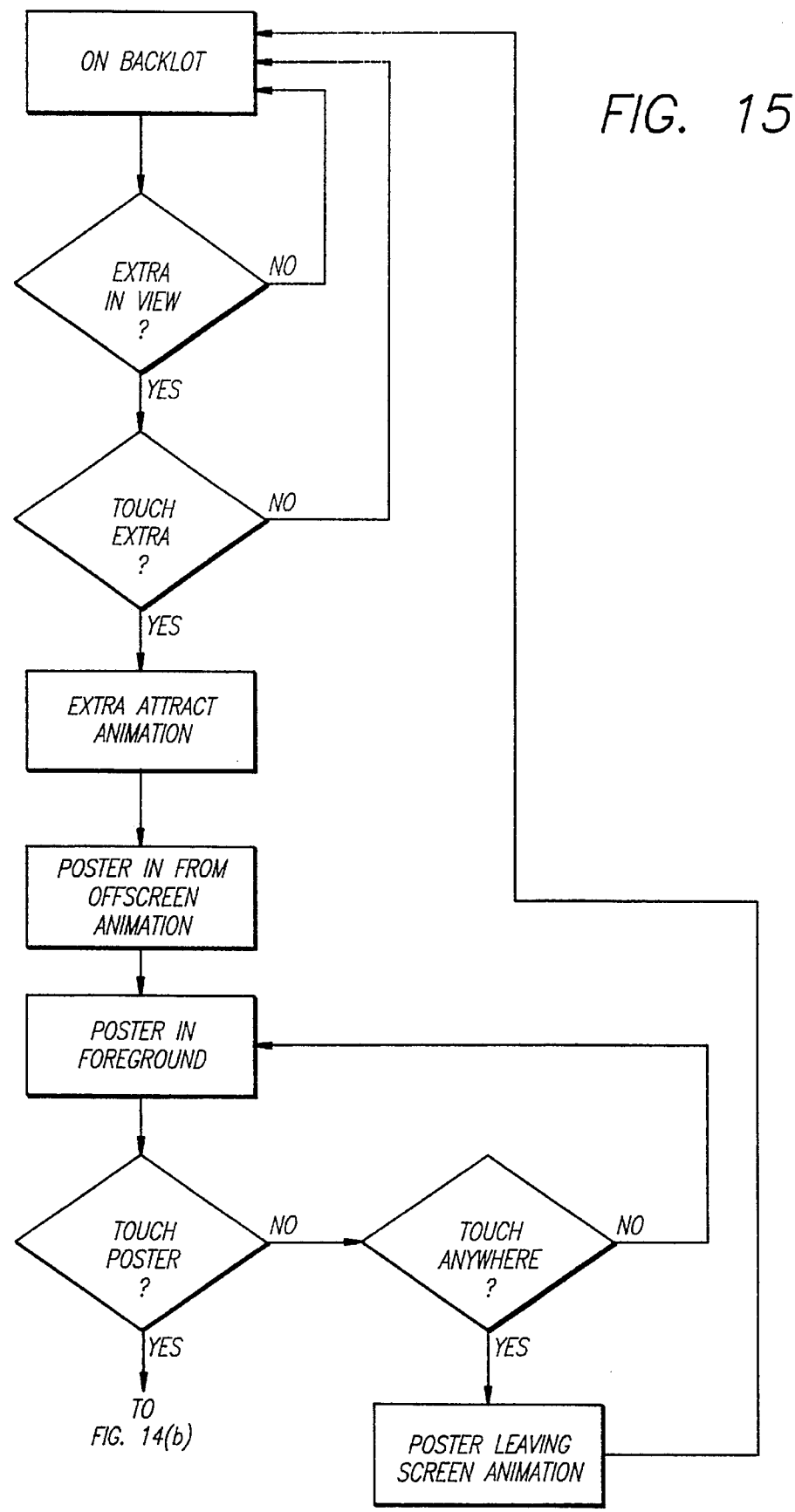
FIG. 15 is a flow chart illustrating the selection and operations of Extras displayed on the interface of the present invention.

Referring now to FIGS. 13 and 15, the present invention's graphic user interface includes "Extras" which operate asynchronously in the studio back lot metaphor and notify the user of events, advertisements, and/or available video on demand movies and the like. Extras are manifestations of the Agent as disclosed in the Parent application. As provided in the Parent, an Agent is an anthropomorphic character which aids the user in navigating around the user interface, and in dealing with events that occur in the "world" created by the user interface. In the studio back lot metaphor of the present invention, Extras are manifestations of advertising which wander randomly throughout the back lot metaphor. Extras can be ignored by the user, or alternatively, may be activated by selecting the Extra displayed on screen 29 (utilizing the remote control 30). One example of an Extra is shown in FIG. 13. An Extra in the form of a "Cupid" 170 changes form if selected by the user utilizing the remote control 30, and performs a short animation prior to displaying a Poster for an available video not otherwise shown on the Poster wall 80, or displaying an advertisement for a Poster on the Poster wall 80. Once the Extra introduced a Poster, the Poster behaves as do other Posters displayed upon the Poster wall 80. It is contemplated that Extras can also "advertise" other Spaces in the studio back lot metaphor. For example, an Extra may advertise the "Critic's Cafe", "Archive" or other Space within the back lot world. If a user activates that Extra, the user is then transported to the Space which was advertised by the Extra. Extras may also advertise related services available to the user, including for example, pizza delivery services, local/national merchants, or news, weather or sports programming.

Although Extra 170 of FIG. 13 is shown as having the form of a Cupid, it will be appreciated that the Extra can take on any shape. For example, as shown in the videotape entitled "VOD Graphical User Interface", Extras take the form of bats, spaceships, cupids, and the like. In effect, an Extra notifies the user of asynchronous events, and like the Agent in the Parent application, may move in a semi-random order from Space to Space within the back lot metaphor.

Referring now to FIG. 15, a flow chart illustrating the operation and sequence of steps executed by the CPU 50 in the generation and display of Extras is shown. As illustrated in FIG. 15, if an Extra is in view on the television screen 29, it will be displayed on the back lot until it is touched or otherwise activated by a user. Upon activation, the CPU 50 modifies the visual appearance of the Extra to that of a Poster through an animation series. The Poster is then displayed in the foreground of the area of the studio back lot metaphor which the user is currently viewing. If a user does not wish to select the video advertised by the Extra, he may select other areas outside of the Poster using the remote control device 30. The CPU 50 then generates a Poster "leaving" screen animation sequence and the user is free to continue to navigate throughout the studio back lot metaphor.

In the event that the user desires to view the video advertised by the Poster introduced by the Extra, he may touch the Poster and CPU 50 executes the steps illustrated in FIGS. 14(*a*)–14(*i*), as previously described with reference to the Poster wall 80. Similarly, if the Extra advertises other parts of the back lot metaphor, the activation of the Extra will result in the user being transported to that area on the back lot.

SUMMARY

The present invention as described provides methods and apparatus for a unique graphical user interface for video on demand, interactive television, and other audiovisual programs and services. The present invention's functions and features provide a user interface which assists subscribers to find and view programs and movies of interest, access related information, control a variety of audiovisual functions and devices, and order video on demand services from their homes and offices.

The teachings of the present invention may be applied to numerous other display devices and input mechanisms. For example, the present invention may be practiced using what is known as "virtual reality" input devices, such as but not limited to, a data input glove, body glove input device, etc.

In addition, the present invention may be utilized with eye goggle displays which are worn by a user and coupled to the computer display system via fiber optics, wires and the like. When the present invention is utilized in conjunction with a virtual reality system, the user interface of the present invention would be viewed by a user through input goggles as being suspended in space. Interaction with the interface by the user may be done using an input glove or other virtual reality device worn by the user. Accordingly, it will be appreciated that the user interface of the present invention is not limited to conventional input or display devices. The reader is referred to the following references for a further description of existing and proposed virtual reality systems. *Computerized Reality Comes of Age*, NASA Tech Briefs, page 10, August 1990 (Vol. 14, number 8); Iwata, *Artificial Reality with Force-Feedback; Development of Desktop Virtual Space with Compact Master Manipulator*, ACM SIG-GRAPH, August 1990 (Vol. 24, number 4); Nash, *Our Man in Cyberspace Checks out Virtual Reality*, Computerworld, Oct. 15, 1990; Daviss, Grand Illusions, Discover, June 1990.

While the present invention has been described with reference to FIGS. 1 through 15, it will be appreciated that the Figures are for illustration only, and do not limit the spirit and scope of the invention. By necessity, the description provided in the Specification describes, for example, screen images having certain attributes and features, however, it will be appreciated that the invention is not limited by the specific examples provided herein.

We claim:

1. A display system for display of audiovisual programming, comprising:

a receiver including a circuit for receiving said audiovisual programming from an audiovisual program source;

a user interface for the display of said audiovisual programming on a display, said user interface incorporating a metaphor having a plurality of Spaces, wherein at least one of said Spaces presents said user with a plurality of representations of available audiovisual programming for display on said display, and further wherein said Spaces are arranged such that each of said Spaces is disposed relative to one another within said metaphor;

a user interacting with said Spaces using a user input device, said interaction permitting said user to select a desired audiovisual program, such that said selection results in said selected audiovisual program being displayed on said display;

an element enabling said user to navigate between said Spaces in said metaphor;

wherein said user interface further includes an Agent which moves within said metaphor in an animated fashion between said Spaces.

2. The display system as defined by claim 1 wherein said Agent, upon activation by said user using said input device, displays a representation of an additional audiovisual program selectable by said user.

3. The display system as defined by claim 1 or 2 wherein upon said selection of one of said representations by said user using said input device, said user interface displays a video viewing space on said display.

4. The display system as defined by claim 3 wherein said audiovisual program corresponding to said selected representation is displayed for viewing by said user in said video viewing space.

5. The display system as defined by claim 4 wherein said video viewing space includes a plurality of user selectable controls displayed on said display.

6. The display system as defined by claim 5 wherein a preview of said selected audiovisual program of said selected representation is displayed prior to said selected audiovisual program, said selected audiovisual program being displayed upon a further selection of said selected representation by said user.

7. The display system as defined by claim 6 wherein said at least one of said Spaces presenting said user with a plurality of said representations of available programming is in a form of a wall, and each of said plurality of representations is in a form of a Poster disposed on said wall.

8. The display system as defined by claim 7 wherein upon said user selecting one of said Posters disposed on said wall, said Poster is displayed in an animated form in a foreground of said metaphor on said display.

9. The display system as defined by claim 8 wherein said Poster displayed in animated form on said display further displays additional information relating to the audiovisual representation to which said Poster relates.

10. The display system as defined by claim 9 wherein said Agent, upon selection by a user, is displayed on said interface as changing into the form of a Poster in the foreground of said metaphor on said display.

11. The display system as defined by claim 10 wherein said Agent which has changed into the form of said Poster displayed in animated form on said display, further displays additional information relating to the audiovisual representation to which said Poster relates.

12. The display system as defined by claim 11 wherein said controls displayed on said display in said video viewing space includes a volume adjustment control selectable by said user.

13. The display system as defined by claim 11 wherein said controls displayed on said display in said video viewing space includes a mute control adjustment selectable by said user.

14. The display system as defined by claim 11 wherein said controls displayed on said display in said video viewing space includes a Wayback exit control selectable by said user, the selection of said exit control resulting in said user interface automatically navigating said user to the last Space from which said user was located in said metaphor prior to said user entering said video viewing space.

15. The display system as defined by claim 11 wherein said audiovisual source comprises a video on demand server for providing a plurality of user selectable audiovisual programs to said receiver.

16. The display system as defined by claim 15 wherein said audiovisual source further provides television audiovisual programming to said receiver.

17. The display system as defined by claim 16 wherein said controls displayed in said video viewing space includes a video purchase control selectable by said user for purchasing an audiovisual program selected by said user.

18. The display system as defined by claim 17 wherein said video purchase control may be activated by said user during the display of a preview of said selected audiovisual program in said video viewing space.

19. The display system as defined by claim 17 wherein said controls displayed in said video viewing space includes a television channel selector, said user selecting a desired television channel for viewing on in said video viewing space using said input device.

20. The display system as defined by claim 17 wherein said controls displayed in said video viewing space include an intermission control, activation of said intermission control by said user resulting in said video on demand server pausing said selected video purchased by said user using said video purchase control.

21. The display system as defined by claim 20 wherein said video on demand server pauses said selected video purchased by said user for a predetermined time.

22. The display system as defined by claim 21 wherein said input device includes a touch sensitive screen.

23. The display system as defined by claim 21 wherein said input device comprises a remote control device in communication with said receiver.

24. In a display system for display of audiovisual programming, a method for the display and selection of said programming comprising the steps of:

providing an element including a circuit for receiving said audiovisual programming from an audiovisual program source;

providing a user interface for the display of said audiovisual programming on a display, said user interface incorporating a metaphor having a plurality of Spaces, wherein at least one of said Spaces presents said user with a plurality of representations of available audiovisual programming for display on said display, and further wherein said Spaces are arranged such that each of said Spaces is disposed relative to one another within said metaphor;

providing an element for interacting with said Spaces using a user input device, said interaction permitting a user to select a desired audiovisual program, such that said selection results in said selected audiovisual program being displayed on said display;

enabling said user to navigate between said Spaces in said metaphor;

wherein said user interface further includes an Agent which moves within said metaphor in an animated fashion between said Spaces.

25. The method as defined by claim 24 wherein said Agent, upon activation by said user using said input device, displays a representation of an additional audiovisual program selectable by said user.

26. The method as defined by claim 24 or 25 wherein upon said selection of one of said representations by said user using said input device, said user interface displays a video viewing space on said display.

27. The method as defined by claim 26 wherein said audiovisual program corresponding to said selected representation is displayed for viewing by said user in said video viewing space.

28. The method as defined by claim 27 further including the step of displaying in said video viewing space a plurality of user selectable controls displayed on said display.

29. The method as defined by claim 28 further including the step of displaying a preview of said selected audiovisual program of said selected representation prior to said selected audiovisual program, said selected audiovisual program being displayed upon a further selection of said selected representation by said user.

30. The method as defined by claim 29 wherein said at least one of said Spaces presenting said user with a plurality of said representations of available programming is in a form of a wall, and each of said plurality of representations is in a form of a Poster disposed on said wall.

31. The method as defined by claim 30 wherein upon said user selecting one of said Posters disposed on said wall, said poster is displayed in an animated form in a foreground of said metaphor on said display.

32. The method as defined by claim 31 wherein said poster displayed in animated form on said display further displays additional information relating to the audiovisual representation to which said Poster relates.

33. The method as defined by claim 31 wherein said Agent, upon selection by a user, is displayed on said interface as changing into the form of a Poster in the foreground of said metaphor on said display.

34. The method as defined by claim 33 wherein said Agent which has changed into the form of said Poster displayed in animated form on said display, further displays additional information relating to the audiovisual representation to which said Poster relates.

35. The method as defined by claim 28 further including the step of displaying a volume adjustment control selectable by said user as one of said controls displayed on said display in said video viewing space.

36. The method as defined by claim 28 further including the step of displaying a mute control adjustment control selectable by said user as one of said controls displayed on said display in said video viewing space including.

37. The method as defined by claim 28 further including the step of displaying said controls displayed on said display in said video viewing space including a Wayback exit control selectable by said user, the selection of said Wayback exit control resulting in said user interface automatically navigating said user to the last Space from which said user was located in said metaphor prior to said user entering said video viewing space.

38. The method as defined by claim 28 wherein said audiovisual source comprises a video on demand server for providing a plurality of user selectable audiovisual programs to said receiver.

39. The method as defined by claim 38 wherein said audiovisual source further provides television audiovisual programming to said receiver.

40. The method as defined by claim 39 further including the step of displaying a video purchase control selectable by said user for purchasing an audiovisual program selected by said user as one of said controls displayed in said video viewing space.

41. The method as defined by claim 40 wherein said video purchase control may be activated by said user during the display of a preview of said selected audiovisual program in said video viewing space.

42. The method as defined by claim 41 further including the step of displaying a television channel selector, said user selecting a desired television channel for viewing on in said video viewing space using said input device.

43. The method as defined by claim 42 further including the step of displaying an intermission control, the activation of said intermission control by said user resulting in said video on demand server pausing said selected video purchased by said user using said video purchase control.

44. The method as defined by claim 43 wherein said video on demand server pauses said selected video purchased by said user for a predetermined time upon the activation of said intermission control.

45. The method as defined by claim 44 wherein said input device includes a touch sensitive screen.

46. The method as defined by claim 44 wherein said input device comprises a remote control device in communication with said receiver.

47. A video display system for display of video programming comprising:

a settop box including a circuit for receiving said video programming from a video server;

a user interface for the display of said video programming on a display, said user interface incorporating a metaphor having a plurality of Spaces, wherein at least one of said Spaces presents said user with a plurality of representations of available audiovisual programming for display on said display, and further wherein said Spaces are arranged such that each of said Spaces is disposed relative to one another within said metaphor;

a user interacting with said Spaces using a user input device, said interaction permitting said user to select a desired video program, such that said selection results in said selected video program being displayed on said display;

an element enabling said user to navigate between said Spaces in said metaphor;

said user interface further includes an Extra which moves within said metaphor in an animated fashion between said Spaces.

48. The display system as defined by claim 47 wherein said Extra, upon activation by said user using said input device, displays a representation of an additional audiovisual program selectable by said user.

49. The display system as defined by claim 48 wherein upon said selection of one of said representations by said user using said input device, said user interface displays a video viewing space on said display.

50. The display system as defined by claim 49 wherein said audiovisual program corresponding to said selected representation is displayed for viewing by said user in said video viewing space.

51. The display system as defined by claim 50 wherein said video viewing space includes a plurality of user selectable controls displayed on said display.

52. The display system as defined by claim 51 wherein a preview of said selected audiovisual program of said selected representation is displayed prior to said selected audiovisual program, said selected audiovisual program being displayed upon a further selection of said selected representation by said user.

53. The display system as defined by claim 52 wherein said at least one of said Spaces presenting said user with a plurality of said representations of available programming is in a form of a wall, and each of said plurality of representations is in a form of a Poster disposed on said wall.

54. The display system as defined by claim 53 wherein upon said user selecting one of said Posters disposed on said wall, said Poster is displayed in an animated form in a foreground of said metaphor on said display.

55. The display system as defined by claim 54 wherein said Poster displayed in animated form on said display further displays additional information relating to the audiovisual representation to which said Poster relates.

56. The display system as defined by claim 55 wherein said Extra, upon selection by a user, is displayed on said interface as changing into the form of a Poster in the foreground of said metaphor on said display.

57. The display system as defined by claim 56 wherein said Extra which has changed into the form of said Poster displayed in animated form on said display, further displays additional information relating to the audiovisual representation to which said Poster relates.

58. In an interactive video display system for display of video programming, a method for the display and selection of said video programming comprising the steps of:

providing a settop box, including a circuit, for receiving said video programming from a video server;

providing a user interface for the display of said audiovisual programming on a display, said user interface incorporating a metaphor having a plurality of Spaces, wherein at least one of said Spaces presents said user with a plurality of representations of available video programming for display on said display, and further wherein said Spaces are arranged such that each of said Spaces is disposed relative to one another within said metaphor;

interacting with said Spaces using a user input device, said interaction permitting a user to select a desired video program, such that said selection results in said selected video program being displayed on said display;

enabling said user to navigate between said Spaces in said metaphor;

wherein said at least one of said Spaces is in a form of a wall and presents said user with said plurality of said representations of available video programming, said representations in a form of video Posters disposed on said wall;

said user interface further includes an Extra which moves within said metaphor in an animated fashion between said Spaces.

59. The method as defined by claim 58 wherein said Extra, upon activation by said user using said input device, displays a Poster of an additional video program selectable by said user.

60. The method as defined by claim 59 further including the step of displaying a preview of said selected video program of said selected Poster prior to said selected video program, said selected video program being displayed upon a further selection of said selected Poster by said user.

61. The method as defined by claim 60 wherein upon said user selecting one of said Posters disposed on said wall, said Poster is displayed in an animated form in a foreground of said metaphor on said display.

62. The method as defined by claim 61 wherein said Poster displayed in animated form on said display further displays additional information relating to the video program to which said Poster relates.

63. The method as defined by claim 62 wherein said Extra, upon selection by a user, is displayed on said interface as changing into the form of a Poster in the foreground of said metaphor on said display.

64. The method as defined by claim 63 wherein said Extra which has changed into the form of said Poster displayed in animated form on said display, further displays additional information relating to the video program to which said Poster relates.

* * * * *

UNITED STATES PATENT AND TRADEMARK OFFICE
CERTIFICATE OF CORRECTION

PATENT NO.: 5,524,195

DATED: June 4, 1996

INVENTOR(S): Charles H. CLANTON, III et al.

It is certified that an error appears in the above-identified patent and that said Letters Patent is hereby corrected as shown below:

Claim 36, line 4, delete "including".

Signed and Sealed this

Twenty-fifth Day of May, 1999

*Attest:*

Q. TODD DICKINSON

*Attesting Officer*   Acting Commissioner of Patents and Trademarks